US006670220B2

(12) United States Patent
Sakuraba et al.

(10) Patent No.: US 6,670,220 B2
(45) Date of Patent: Dec. 30, 2003

(54) SEMICONDUCTOR DEVICE AND MANUFACTURE METHOD OF THAT

(75) Inventors: Tadaki Sakuraba, Tenno (JP); Youkou Ito, Tenno (JP); Hidehiro Takeshima, Akita (JP); Yoshiaki Tamai, Akita (JP); Toru Saga, Akita (JP)

(73) Assignees: Hitachi, Ltd., Tokyo (JP); Akita Electronics Co., Ltd., Akita (JP)

( * ) Notice: Subject to any disclaimer, the term of this patent is extended or adjusted under 35 U.S.C. 154(b) by 147 days.

(21) Appl. No.: 09/939,669

(22) Filed: Aug. 28, 2001

(65) Prior Publication Data

US 2002/0024127 A1 Feb. 28, 2002

(30) Foreign Application Priority Data

Aug. 31, 2000 (JP) ....................... 2000-262918
Jul. 12, 2001 (JP) ....................... 2001-211771

(51) Int. Cl.[7] ................. H01L 21/44; H01L 21/48; H01L 21/50
(52) U.S. Cl. ............... 438/109; 438/111; 438/112; 438/113; 264/272.17
(58) Field of Search ................. 438/109, 111, 438/112, 113, FOR 367, FOR 368, FOR 374; 264/272.17

(56) References Cited

U.S. PATENT DOCUMENTS 4,301,464 A   11/1981   Otsuki et al. ............ 257/670
5,792,676 A   8/1998    Masumoto et al. ......... 438/111
6,469,369 B1  10/2002   Lee ...................... 257/670

FOREIGN PATENT DOCUMENTS

| JP | 10-34699  | 2/1998  |
| JP | 10-70217  | 3/1998  |
| JP | 10-270603 | 10/1998 |

Primary Examiner—David E. Graybill
(74) Attorney, Agent, or Firm—Miles & Stockbridge P.C.

(57) ABSTRACT

A non-leaded semiconductor device which does not cause a flaw and contamination with a foreign substance on mounting surfaces of external electrode terminals of another non-leaded semiconductor device, and a method of fabricating the same. In fabrication of the non-leaded semiconductor device, a matrix-type leadframe containing a matrix of a plurality of unit leadframe patterns is prepared, a semiconductor chip is secured on each unit leadframe pattern, conductive wires are connected between electrodes of the semiconductor chip and inner ends of terminal leads of each unit leadframe pattern, and then single-sided molding is performed to encapsulate the semiconductor chip, conductive wires, and inner end parts of terminal leads in a package part. In this single-sided molding, a contact-preventive part thicker than the package part is formed outside the package part using injected resin. A plurality of the matrix-type leadframes thus processed are stacked one on top of another when the leadframes are stored or supplied. In a stack of the matrix-type leadframes, surfaces of terminal leads serving as external electrode terminals are not flawed or contaminated since the contact-preventive part is located between the leadframes at upper and lower stack positions. Then, each unit leadframe pattern is cut to provide a non-leaded semiconductor device.

14 Claims, 38 Drawing Sheets

SEMICONDUCTOR DEVICE AND MANUFACTURE METHOD OF THAT

BACKGROUND OF THE INVENTION

1. Field of the Invention

The present invention relates to a technique of fabricating resin-molded semiconductor devices by using leadframes, and more particularly to a technique suitable for fabricating non-leaded semiconductor device packages having a structure in which external electrode terminals are exposed on a mounting face thereof instead of sidewise lead protrusion, such as small outline non-leaded (SON) packages and quad flat non-leaded (QFN) packages.

2. Description of the Related Art

Leadframes, produced by forming a metal sheet into a desired pattern through fine blanking or etching, are used in fabrication of resin-molded semiconductor devices. Each leadframe unit portion comprises a tab, which is a pad part for mounting a semiconductor chip, and a plurality of leads having tip ends (inner ends) thereof disposed spacedly around the tab. The tab is supported by tab suspension leads extending from frame parts of the leadframe.

In fabrication of resin-molded semiconductor devices by using leadframes such as mentioned above, a semiconductor chip is secured on the tab of each leadframe unit portion, conductive wires are connected between electrodes of the semiconductor chip and the tip ends of the leads, and then the inner lead area including the conductive wires and the semiconductor chip is sealed with resin to form a package for encapsulation. In this process, unnecessary leadframe parts including any protruding parts of leads and tab suspension leads are cut and removed from the package.

According to a known practice in resin-molded semiconductor device fabrication using leadframes, single-sided molding is made on one side of each leadframe unit portion to form a package having a structure in which external electrode terminals (leads) are exposed on a mounting face thereof while no lead protrusion from the periphery thereof is made. This type of semiconductor device package includes an SON package in which leads are exposed along two side edges of a mounting face thereof and a QFN package in which leads are exposed along four side edges of a mounting face thereof in a quadrangular form.

In Japanese Unexamined Patent Publications No. H10 (1998)-34699 and No. H10 (1998)-70217, there are disclosed fabrication techniques for SON packages. In the former, it has been proposed to provide a technique in which a metal mold is covered with an elastic, heat-resistant release film to prevent occurrence of resin burrs at resin sealing in semiconductor device fabrication. In the latter, it has been proposed to provide a technique in which a groove having a cross-sectional shape of an approximately circular arc is formed on a lead-to-lead surface area of mold resin for elongation of a lead-to-lead insulation distance and for prevention of occurrence of resin burrs on a surface where leads are exposed.

Further, Japanese Unexamined Patent Publication No. H10 (1998)-270603 discloses an area-package-type semiconductor device and a method of fabrication thereof. According to this disclosure, as in fabrication of ball-grid-array semiconductor devices, a semiconductor chip is secured on the surface side of a substrate (resin substrate made of glass epoxy resin or the like), external electrodes are disposed in a grid form on the back side thereof, and the semiconductor chip on the surface side is covered with a resin package part. A plurality of area-package-type semiconductor devices are provided in a row on each substrate.

For preventing the external electrodes from being flawed when the substrates are stacked one on top of another, protrusion parts higher than the height of the resin package part are provided on substrates at two or more corners. Thus, the external electrodes will not come into contact with a resin package part of another semiconductor device at the lower position.

For protecting the external electrodes at the time of substrate stacking, it is required to form at least two protrusion parts crosswise with respect to the longitudinal substrate direction.

Non-leaded semiconductor device packages fabricated by single-sided molding, including SON and QFN packages, are used to meet requirements for reduction in physical size and elimination of deformation of external electrode terminal leads.

Since the terminal exposure side of the non-leaded semiconductor device package is used for mounting, the mounting area thereof is smaller than that of a semiconductor device package of a sidewise lead protrusion type, such as a small outline package (SOP) or a quad flat package (QFP). Therefore, on the non-leaded semiconductor device package, if foreign matter adheres to the leads (external electrode terminals) or the leads are flawed, the mounting reliability thereof is degraded.

Referring to FIGS. 34, 35 and 36, there are shown schematic diagrams of mounting conditions in which a non-leaded semiconductor device 1 is mounted on a wiring board 50 such as a mother board. A lead (external electrode terminal) 4 exposed on a mounting face 3 of a package part 2 of the non-leaded semiconductor device 1 is bonded to a land 52 on the wiring board 50 via a bonding material (solder) 51. On a surface part of the lead 4 (mounting surface), a plating film 54 is provided to enhance the wettability of solder (solderability). In these figures, the plating film 54 is indicated as a solid thick line. The plating film 54 is formed by Pb—Sn soldering or palladium-plating (for avoiding the use of Pb as a soldering material).

In pre-plating, a palladium plating film is formed on a leadframe in advance. In post-plating, the soldering film 54 is formed after molding. In soldering film formation, solder is used as a soldering material. In palladium plating film formation, an alloy material not containing Pb, such as Sn—Zn or Sn—Ag, is used.

FIG. 34 shows a normal mounting condition in which no abnormality is found in mounting. For example, the solder 51 is formed over the entire mounting surface of the lead 4, and a fillet 55 is formed adequately on the outer end face of the lead 4. In visual inspection, it can be judged that the solderability is good.

As shown in FIG. 35, if a foreign substance 56 adheres to the exposure surface of the lead 4, electrical connection is not provided at a region having the foreign substance 56, which could cause poor continuity.

As shown in FIG. 36, if the exposure surface of the lead 4 is flawed to cause partial missing of the plating film 54, the solder 52 is not formed at a region having no plating film. In this condition, poor continuity is prone to occur due to a decrease in bonding area. In the example shown in FIG. 36, since the region having no plating film due to a flaw on the exposure surface of the lead 4 is located at the outer end side, a fillet is not formed adequately. In visual inspection, it is therefore possible to check for poor bonding. If the exposure surface of the lead 4 is flawed at the inner side thereof, a region having no plating film cannot be detected in visual inspection, i.e., a check for poor continuity cannot be made. This could cause degradation in mounting reliability.

As can be seen from the above, in fabrication of non-leaded semiconductor devices, it is required to prevent partial missing of a plating film due to a foreign substance or a flaw on a mounting surface of any lead.

At the workplace of the inventors, non-leaded semiconductor device packages such as QFN and SON packages are manufactured using metallic matrix-type leadframes. The matrix-type leadframe comprises a plurality of unit patterns (unit leadframe patterns) which are arranged on a plurality of rows and columns in a matrix form. On each unit leadframe pattern of the matrix-type leadframe, one non-leaded semiconductor device is formed. More specifically, a semiconductor chip is secured on the center part of each unit leadframe pattern, conductive wires are bonded between electrodes of the semiconductor chip and the inner ends of leads, and then single-sided molding is made on the semiconductor chip and conductive wires to form a package.

In fabrication of non-leaded semiconductor devices using matrix-type leadframes at the workplace of the inventors, after a package is formed on each unit leadframe pattern, the matrix-type leadframes are stacked one on top of another in cases where they are stored or where they are loaded onto a lead cutting apparatus.

In these cases, each leadframe is placed on the top of an insulating-resin package part on another leadframe. In some situations, a mounting surface of a leadframe comes in contact with a package part on another leadframe at the lower position, causing a flaw or contamination on the mounting surface thereof.

Therefore, the inventors devised an arrangement in which a contact-preventive part higher than the height of each package part is provided so that a mounting surface of a leadframe will not come into contact with a package part on another leadframe at the lower position. For this arrangement, the contact-preventive part is formed in a flow cavity communicating with a cavity of a metal mold used for package molding.

More specifically, the flow cavity is provided for the purpose of preventing air from remaining in the metal mold cavity. In the arrangement devised by the inventors, the height (depth) dimension of the flow cavity is made larger than that of the metal mold cavity, and the contact-preventive part is formed by setting resin in the flow cavity.

In Japanese Unexamined Patent Publication No. H10 (1998)-270603 mentioned above, it has been proposed to provide a technique for preventing occurrence of a flaw on external electrodes on ball-grid-array semiconductor devices.

It has been found, however, that this technique is not applicable without difficulty to fabrication of non-leaded semiconductor devices by using matrix-type leadframes.

To be more specific, according to the disclosure in Japanese Unexamined Patent Publication No. H10 (1998)-270603, ball-grid-array semiconductor devices are fabricated by forming a row of quadrangular resin packages along the longitudinal direction of a long substrate. In embodiment, resin is injected through one corner of a quadrangular cavity to form a resin package, and protrusion parts are formed at positions corresponding to the remaining two or three corners. In an air vent of a transfer metal mold, there is provided a pool area. A protrusion part higher than the height of a resin package part is formed by setting resin in this pool area.

On the matrix-type leadframe, a plurality of packages are formed in a matrix consisting of "n" rows by "m" columns. Therefore, if the above-mentioned technique of fabricating ball-grid-array semiconductor devices is applied to semiconductor device fabrication using matrix-type leadframes, it is required to feed resin to "m" by "n" cavities and "2 or 3" by "m" by "n" pool areas for forming packages and protrusion parts. The amount of resin to be fed to a runner extending to each cavity must be increased substantially in this application.

Consequently, a longer period of time is taken to fill resin in a cavity located farther apart from a pot, causing an increase in resin viscosity. A flow of resin having higher viscosity could tilt wires to cause a defect of short-circuiting with an adjacent lead or electrode.

In Japanese Unexamined Patent Publication No. H10 (1998)-270603, since electrodes of a semiconductor chip are connected onto a substrate made of a resin material such as glass epoxy resin by means of face-down bonding, it is not necessary to take into consideration a possible defect of short-circuiting due to wire deformation.

Further, according the conventional method of semiconductor device fabrication, the performance of a transfer mold apparatus must be enhanced for increasing the amount of resin to be injected and for increasing injection pressure. This increases the cost of the transfer mold apparatus, resulting in an increase in the cost of semiconductor device fabrication.

Still further, according to the conventional method of semiconductor device fabrication, two or three protrusion parts are formed per package to increase the amount of resin to be used, resulting in an increase in the cost of semiconductor device fabrication.

Furthermore, where the conventional arrangement in which two or three pool areas are provided per cavity is applied to semiconductor device fabrication using matrix-type leadframes, the size of the leadframe must be increased to form the pool areas. In the technique disclosed in Japanese Unexamined Patent Publication No. H10 (1998)-270603, protrusion parts must be formed on substrates at two or more corners in package molding. Where this technique is applied to semiconductor device fabrication using matrix-type leadframes, it is required to increase the size of each unit leadframe pattern to cause a decrease in frame usage efficiency, resulting in an increase in the cost of semiconductor device fabrication.

Still further, where the technique disclosed in Japanese Unexamined Patent Publication No. H10 (1998)-270603, in which protrusion parts must be formed on substrates at two or more corners in package molding, is applied to semiconductor device fabrication using matrix-type leadframes, the amount of resin to be used is increased to result in an increase in the cost of semiconductor device fabrication.

SUMMARY OF THE INVENTION

It is therefore an object of the present invention to provide a method of fabricating non-leaded semiconductor devices having satisfactory mounting performance.

Another object of the present invention is to provide a method of fabricating non-leaded semiconductor devices while preventing occurrence of a flaw and adhesion of a foreign substance on mounting surface parts of external electrode terminals.

A further object of the present invention is to provide a method of fabricating non-leaded semiconductor devices with reduction in cost.

An even further object of the present invention is to provide a method of manufacturing electronic apparatus having excellent quality and high reliability.

The following briefly describes representative features and advantages of the present invention:

(1) In carrying out the present invention and according to one aspect thereof, there is provided a semiconductor device comprising: a package part made of insulating resin; a plurality of terminal leads exposed on a mounting face of the package part; and a plurality of tab suspension leads exposed thereon; wherein outer edges of mounting surfaces of the terminal leads and tab suspension leads disposed at the periphery of the package part have no burrs. The package part contains a semiconductor chip, which is secured on a seat area of a tab supported by the tab suspension leads, and a conductive wire is connected between each electrode of the semiconductor chip and each terminal lead. A plating film is formed on each of the terminal leads and tab suspension leads which are exposed on the mounting face of the package part.

According to another aspect of the present invention, there is provided a method of fabricating the above-mentioned semiconductor device, comprising the steps of:

preparing a matrix-type leadframe containing a matrix of a plurality of unit leadframe patterns, each of which comprises a frame part, a tab located inside the frame part, a plurality of tab suspension leads extending from the frame part to the tab for supporting the tab by the tip ends thereof, and a plurality of terminal leads extending from the frame part toward the tab;

securing a semiconductor chip on the tab;

connecting conductive wires between electrodes of the semiconductor chip and inner end parts of the terminal leads;

performing single-sided molding to encapsulate the semiconductor chip, the conductive wires, and the inner end parts of the terminal leads in an insulating resin package part in a fashion that the terminal leads and tab suspension leads are exposed on a mounting face of the package part; and cutting the terminal leads and tab suspension leads; wherein, at the step of the single-sided molding, a contact-preventive part thicker than the package part is formed outside the package part, and at the step of the lead cutting, the contact-preventive part is cut.

Further, according to another aspect of the present invention, after the single-sided molding, plating is performed to form a plating film for mounting at each predetermined region on the matrix-type leadframe.

Still further, according to another aspect of the present invention, at the lead cutting step, the terminal leads and tab suspension leads are cut by means of die-punch cutting in which a punch is driven from the mounting face side of the package part.

In accordance with the above-mentioned aspects of the present invention (1), the following advantageous effects can be provided:

(a) In package formation, the contact-preventive part thicker than the package part is formed outside the package part. Therefore, when the leadframes which have been processed through the single-sided molding are stacked one on top of another, external electrode terminals of a leadframe at the upper position do not come into contact with a package part of another leadframe at the lower position since the contact-preventive part is located between the leadframes at the upper and lower positions, preventing occurrence of a flaw and contamination on the external electrode terminals of the leadframe at the upper position. Thus, a non-leaded semiconductor device having high reliability in mounting can be provided.

(b) Since just one contact-preventive part is formed per package part, the amount of resin to be injected does not increase substantially even where the matrix-type leadframe is used. It is therefore not required to increase a pressure of resin injection significantly for transfer molding, thus not causing particular difficulty in transfer molding. Further, it is possible to use a conventional transfer molding apparatus without modification.

(c) Since the amount of resin to be injected for transfer molding does not increase substantially as mentioned in the above item (b), a possible defect of short-circuiting due to wire deformation in a flow of resin will not occur at a distant cavity to which resin is fed through a runner, thus contributing to improvements in yield and reliability.

(d) Since just one contact-preventive part is formed per package part as mentioned in the above item (b), it is not required to substantially increase the size of each unit leadframe pattern, thus contributing to efficient use of the leadframe.

(e) At the step of cutting the terminal leads and tab suspension leads, since the terminal leads and tab suspension leads are cut by means of die-punch cutting in which the punch is driven from the mounting face side of the package part, cutting burrs will not occur at a cut-line edge on the mounting face side while they may occur at a cut-line edge on the side opposite to the mounting face side. Thus, in addition to improvement in the appearance of a i. fabricated non-leaded semiconductor device, it is possible to obviate occurrence of a mounting defect due to cutting burrs.

(f) The advantageous effects mentioned in the above items (a) to (e) make it possible to reduce the cost of semiconductor device fabrication.

The above and other objects, features and advantages of the present invention will become more apparent from the following detailed description with reference to the accompanying drawings.

21

Figure 51:
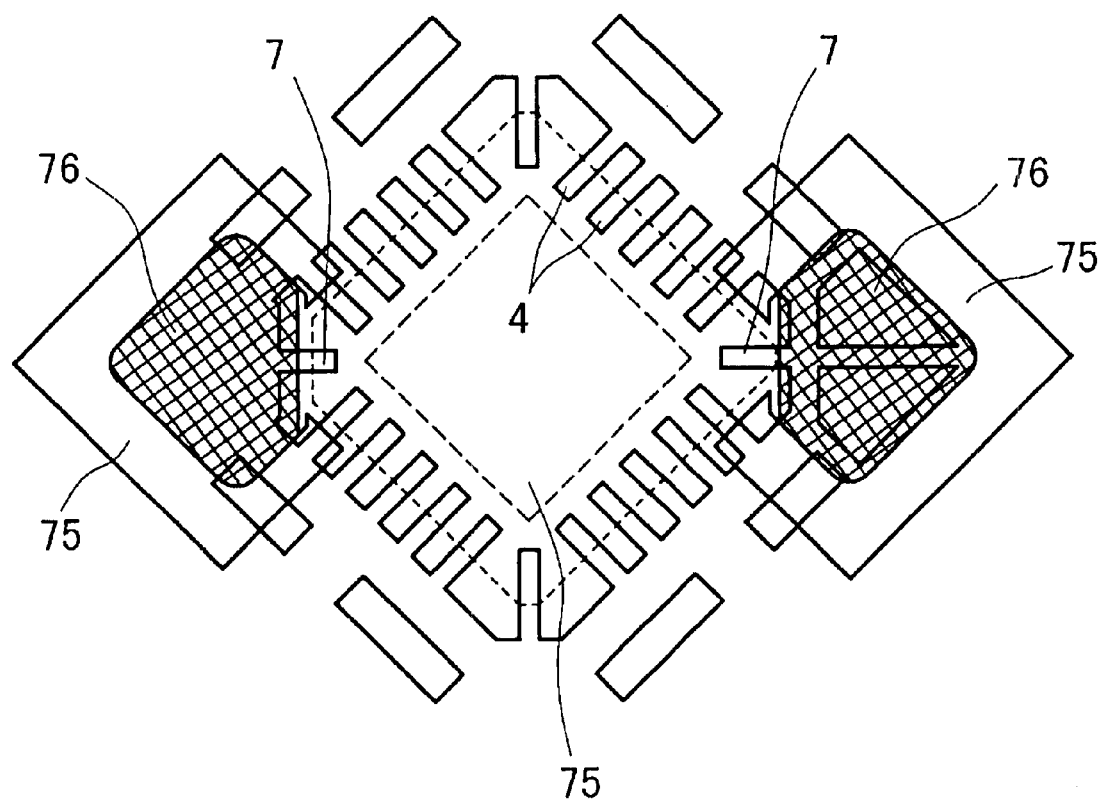
Figure 52:
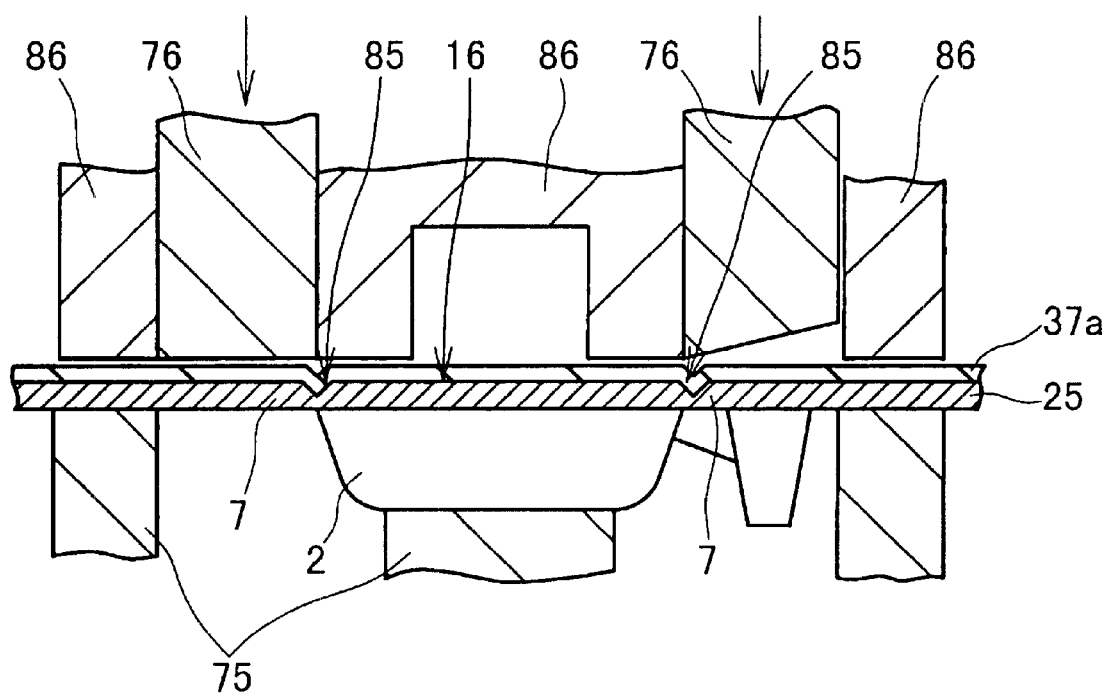
Figure 53A:
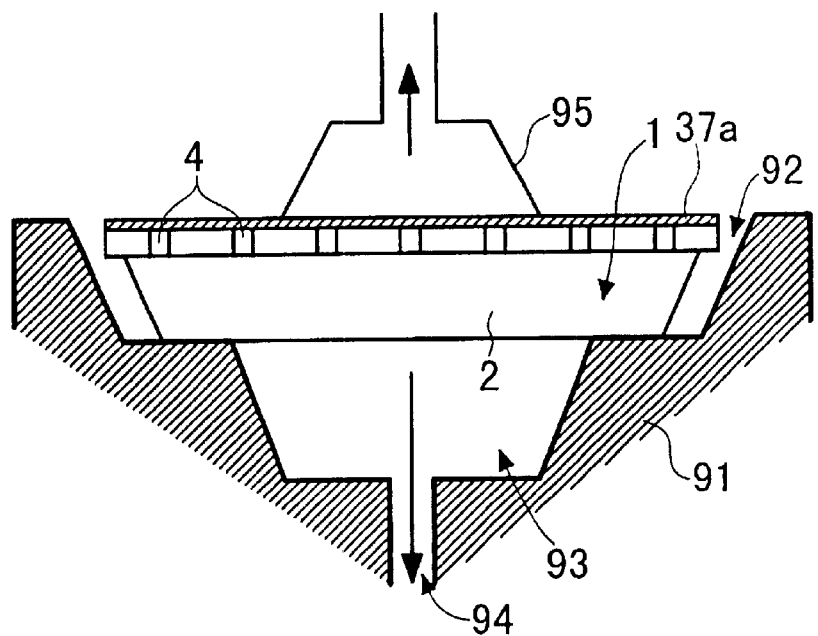
Figure 53B:
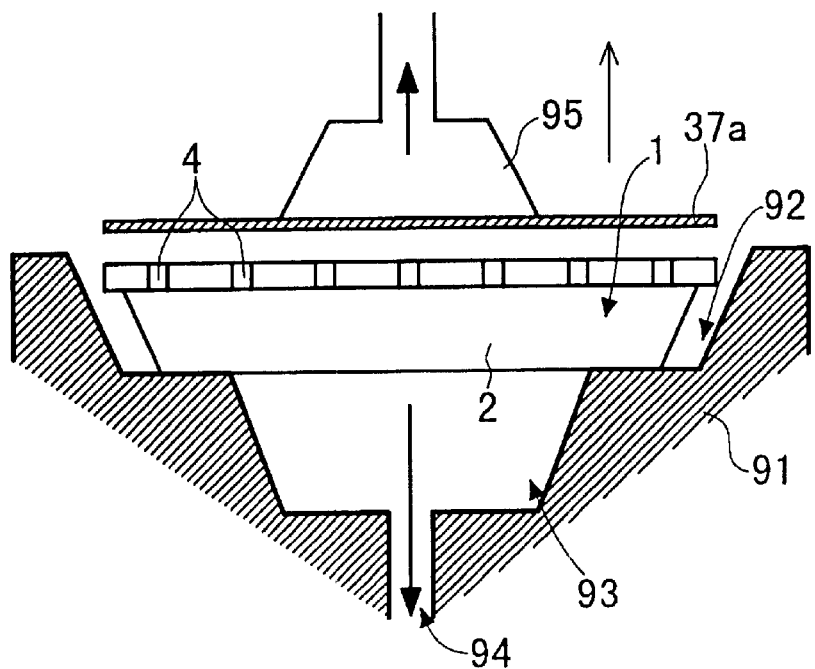
Figure 54A:
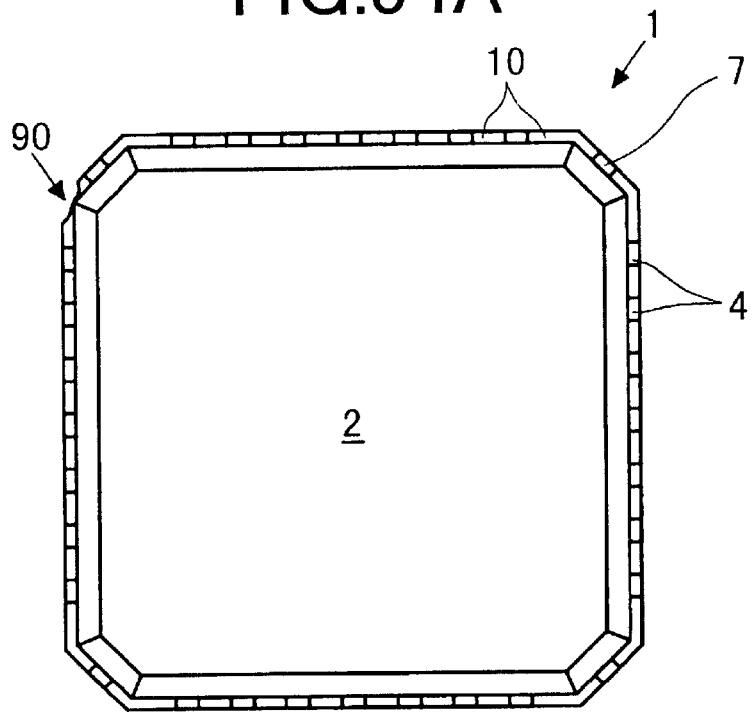
Figure 54B:
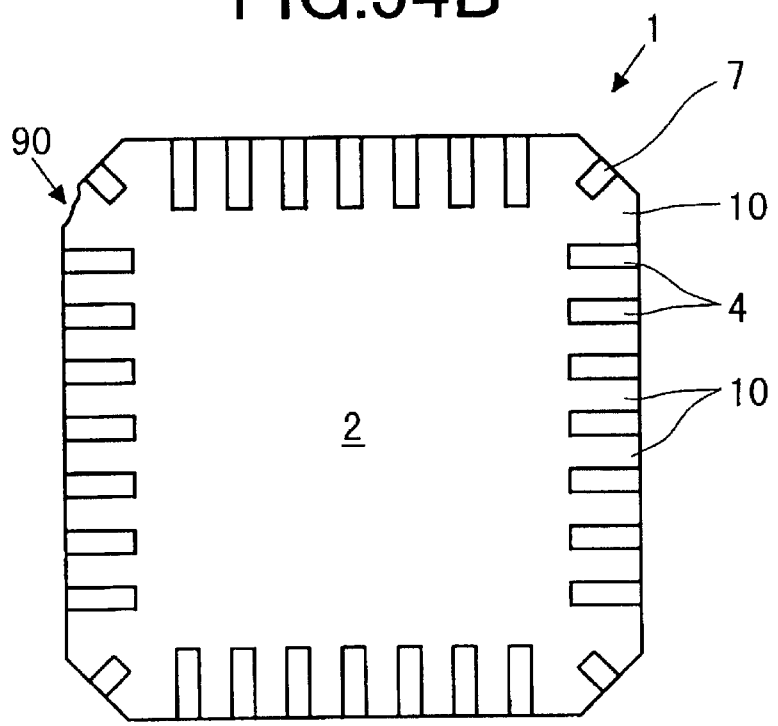

FIG. 51 is a schematic diagram showing a relational arrangement of tab suspension leads on a gate side and a flow cavity side, terminal leads, a punch, and a die in the semiconductor device fabrication method according to the preferred embodiment 2 of the present invention;

FIG. 52 is a schematic cross-sectional view showing a cut-off condition of a gate-set resin part and a flow-cavity-set resin part in the semiconductor device fabrication method according to the preferred embodiment 2 of the present invention;

FIGS. 53A and 53B are schematic diagrams showing removal of a resin sheet from a semiconductor device fabricated in the semiconductor device fabrication method according to the preferred embodiment 2 of the present invention; and FIGS. 54A and 54B are a plan view and a bottom view of a semiconductor device having a nick on an edge of a package part thereof.

DETAILED DESCRIPTION OF THE PREFERRED EMBODIMENTS

The present invention will now be described in detail by way of example with reference to the accompanying drawings. Note that like reference numerals designate like or corresponding parts throughout the drawings prepared for explanation of preferred embodiments of the present invention and repeated descriptions of each element in connection with the individual drawings are not given for the sake of simplicity.

Embodiment 1:

FIGS. 1 to 33 are concerned with a semiconductor device fabrication method according to a preferred embodiment (preferred embodiment 1) of the present invention.

Figure 2:
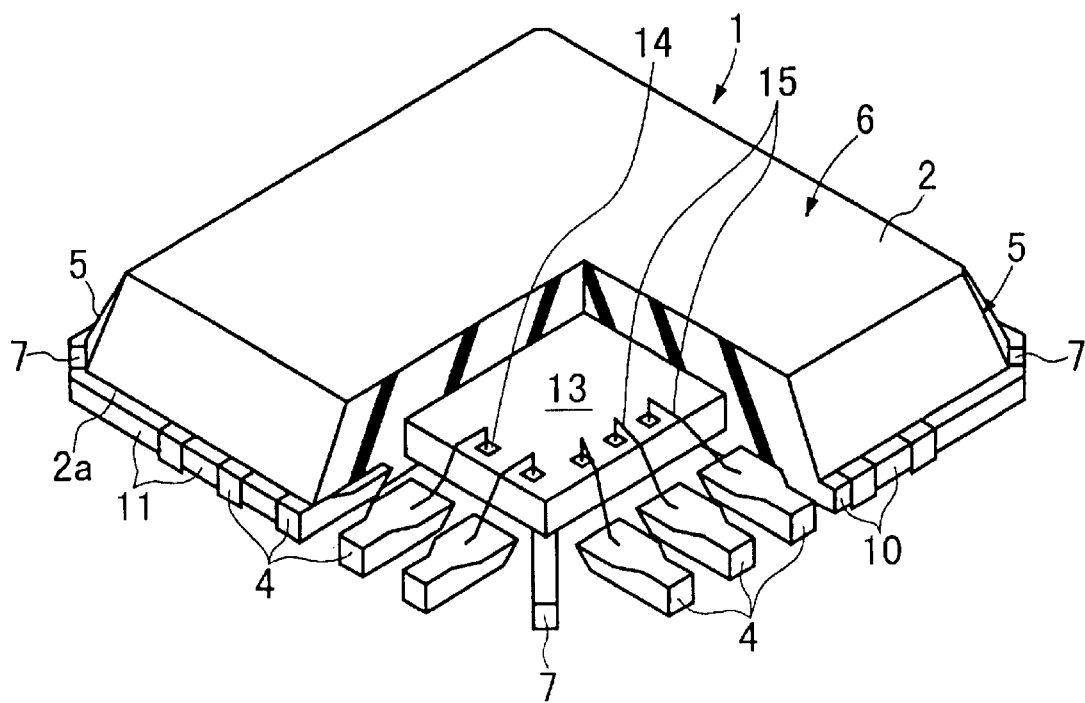
FIG. 2 is a schematic perspective view of a semiconductor device in the preferred embodiment 1, showing a cutaway section thereof.
Figure 3:
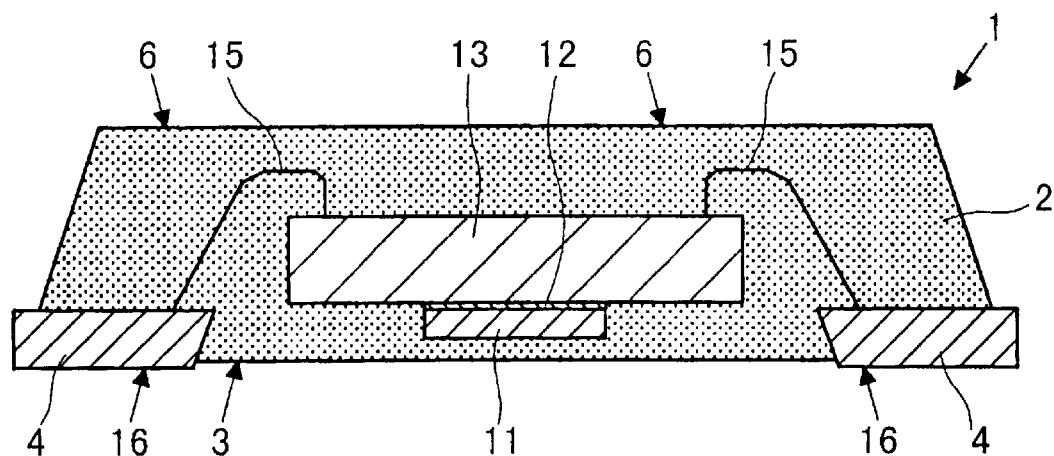
FIG. 3 is a cross-sectional view of the semiconductor device.

The following describes a QFN semiconductor device which is a representative example of a non-leaded semiconductor device fabricated by the semiconductor device fabrication method according to the preferred embodiment 1. FIG. 2 is a perspective view of the QFN semiconductor device, showing a cutaway section thereof. FIG. 3 is a cross-sectional view of the QFN semiconductor device, and FIG. 4 is a bottom view thereof.

Figure 4:
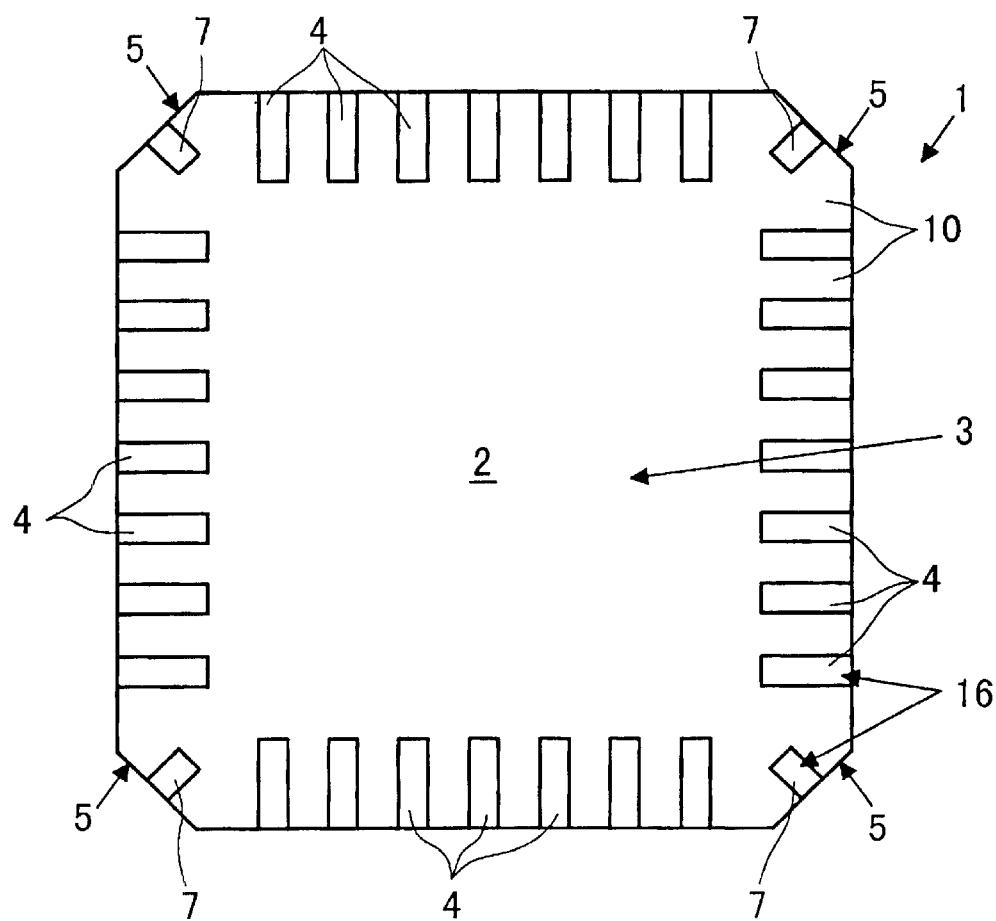
FIG. 4 is a bottom view of the semiconductor device.

As shown in FIGS. 2 to 4, the QFN semiconductor device, indicated by reference numeral 1, comprises an insulating resin package part 2 having a mesa shape. The top of the package part 2 is formed to provide a flat quadrangular (rectangular) face, and each of the four corners thereof is chamfered to provide a slant face 5. One of the four slant faces 5 is a region which has been connected with a gate for injecting mold in the molding of the package part 2, and the remaining three slant faces 5 are regions which have been connected with air vents for releasing air in the molding of the package part 2.

Further, as shown in FIGS. 2 and 3, each of the four side faces of the package part 2 is oblique since a cavity of a metal mold has oblique side faces for facilitating removal of the package part 2 therefrom at the end of molding. Therefore, as can be readily seen from FIG. 3, a top face 6 of the package part 2 is smaller than a mounting face 3 which is the bottom of the package part 2.

On the periphery of the mounting face 3 (back side of the package part 2), there are exposed external electrode terminals (leads) 4. More specifically, the leads 4 are arranged at a predetermined pitch along each side of the mounting face 3 of the package part 2. At each of the four corners (corresponding to the slant faces 5) of the package part 2, i.e., each of the four corners of the mounting face 3, there is exposed a tab suspension lead 7 (see FIGS. 2 and 4).

As indicated in FIG. 2, on a plane between the package part 2 and each of the leads 4 and tab suspension leads 7, the leads 4 and tab suspension leads 7 protrude slightly outward from a foot edge 2a of the package part 2. This arrangement is made for the purpose of support on a die at the time of cutting the leads 4 and tab suspension leads 7, e.g., an outward protrusion of 0.1 mm or less is provided. Although there is a resin burr part 10 between the leads 4 and between each tab suspension lead 7 and its adjacent lead 4, the resin burr part 10 is also cut by means of die-punch cutting. Therefore, on the periphery of the package part 2, the edge of each resin burr part 10 and the end edges of each lead 4 and tab suspension lead 7 are trimmed in a straight line without irregularities.

In fabrication of the semiconductor device 1, transfer molding is performed after mold clamping with a sheet interleaved. Therefore, the mounting face 3 is indented from mounting surfaces 16 (exposure surfaces) of the leads 4 and tab suspension leads 7. Further, in the preferred embodiment 1, since a plating film is formed on a surface of each of the leads 4 and tab suspension leads 7 after single-sided transfer molding, the mounting face 3 of the package part 2 is also indented from the mounting surfaces of the leads 4 and tab suspension leads 7 due to the presence of the plating film formed thereon. In such a structure that the mounting face 3 of the package part 2 is inwardly offset from the mounting surfaces 16 of the leads 4 and tab suspension leads 7, particular solder wetting regions are used when the semiconductor device 1 is surface-mounted on a wiring board (printed circuit board). It is therefore possible to perform satisfactory solder mounting.

As shown in FIG. 3, there is provided a tab 11 in the package part 2 of the semiconductor device 1. A semiconductor chip 13 is secured on the top of the tab 11 using a bonding material 12. The tab 11, which is smaller than the semiconductor chip 13, is supported by the tab suspension leads 7 extending from the four corners of the package part 2 (refer to FIG. 2). The tab 11 is integral with the tab suspension leads 7.

Each electrode 14 formed on the top of the semiconductor chip 13 (refer to FIG. 2) is connected with the inner end part of each lead 4 through a conductive wire 15 to provide electrical connection. The tab 11, semiconductor chip 13, conductive wires 15 are contained in the package part 2. Note that electrical connection between each electrode 14 on the semiconductor chip 13 and each lead 4 may be provided by any means other than conductive wire connection.

In cases where any of the tab suspension leads 7 is used as an external electrode terminal, a ground electrode of the semiconductor chip 13 may be connected with the tab suspension lead 7 through a conductive wire 15.

Figure 5:
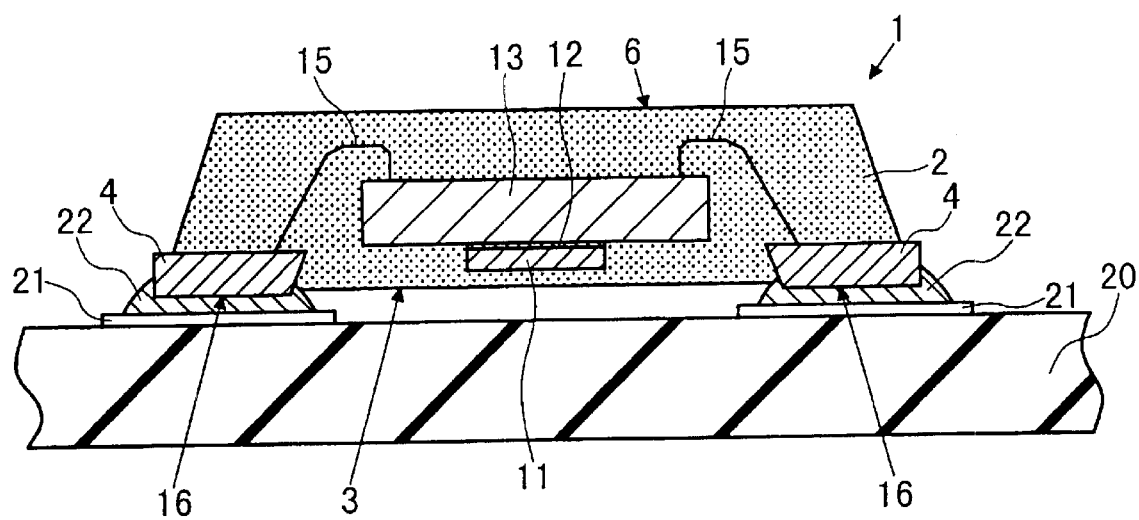
FIG. 5 is a cross-sectional view showing a mounting arrangement of the semiconductor device.

FIG. 5 shows a cross-sectional view of a mounting arrangement in which the semiconductor device 1 is mounted on a wiring board 20. On a surface of the wiring board 20, there are provided electrodes (lands) 21 which correspond to the leads 4 (external electrode terminals) and the tab suspension leads 7 of the semiconductor device 1. On these lands 21, the external electrode terminal leads and tab suspension leads 7 of the semiconductor device 1 are connected via a bonding material 22 such as solder to provide electrical connection.

Figure 6:
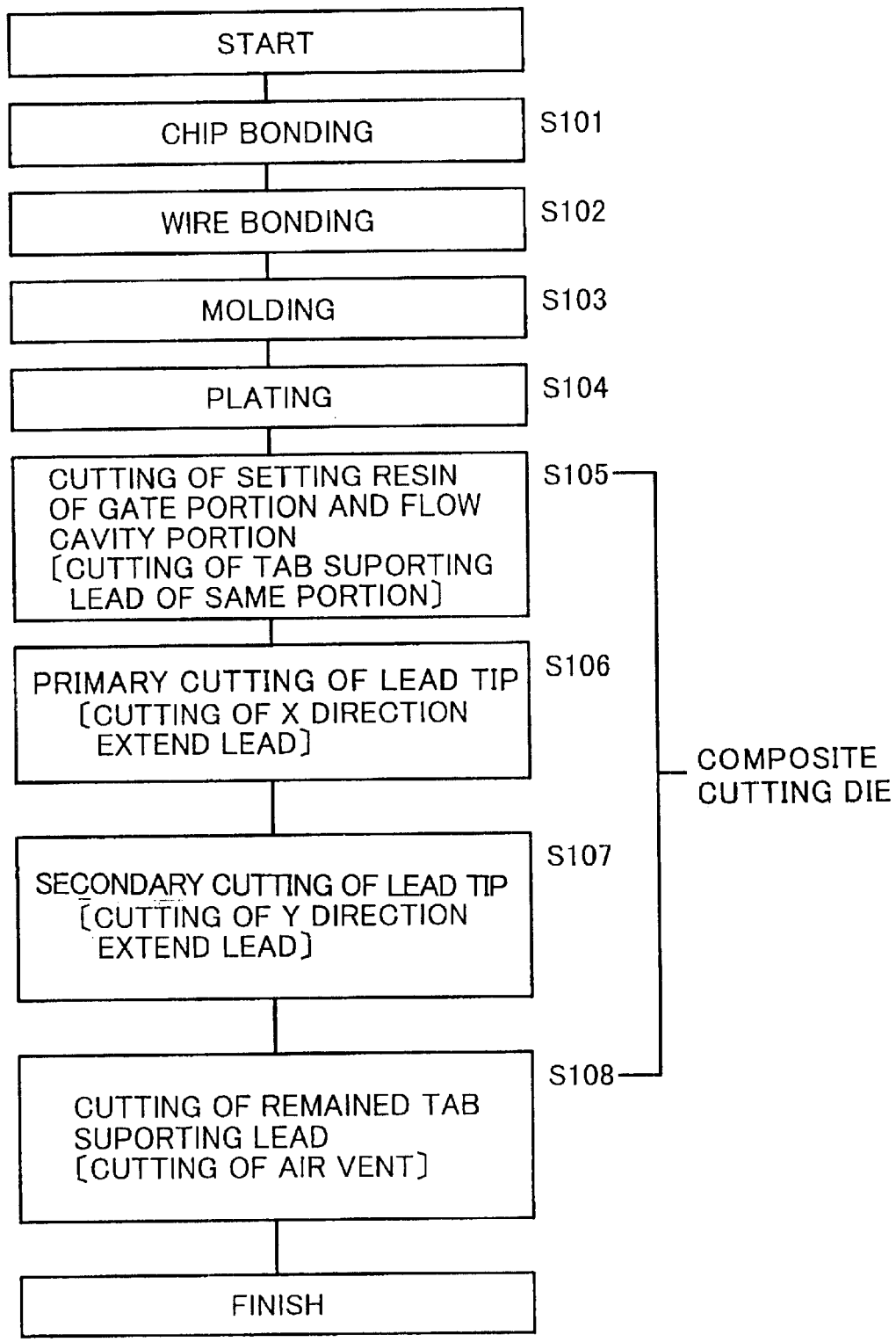
FIG. 6 is a flowchart showing the semiconductor device fabrication method according to the preferred embodiment 1 of the present invention.

Then, the following describes details of semiconductor device fabrication processes in the preferred embodiment 1. Referring to FIG. 6, there is shown a flowchart of the method of fabricating QFN semiconductor devices according to the preferred embodiment 1. The semiconductor device 1 is fabricated through process steps 101 to 108.

More specifically, after the start of semiconductor device fabricating operation, the following process steps are carried out; chip bonding (S101), wire bonding (S102), molding (S103), plating (S104), press cutting of gate-set resin and flow-cavity-set resin (S105), primary press cutting of lead tips (S106), secondary press cutting of lead tips (S107), and press cutting of residual tab suspension leads (S108). At each of the steps of press cutting of gate-set resin and flow-cavity-set resin (S105), primary press cutting of lead tips (S106), secondary press cutting of lead tips (S107), and press cutting of residual tab suspension leads (S108), resin/lead cutting is performed using a composite cutting die.

Figure 7:
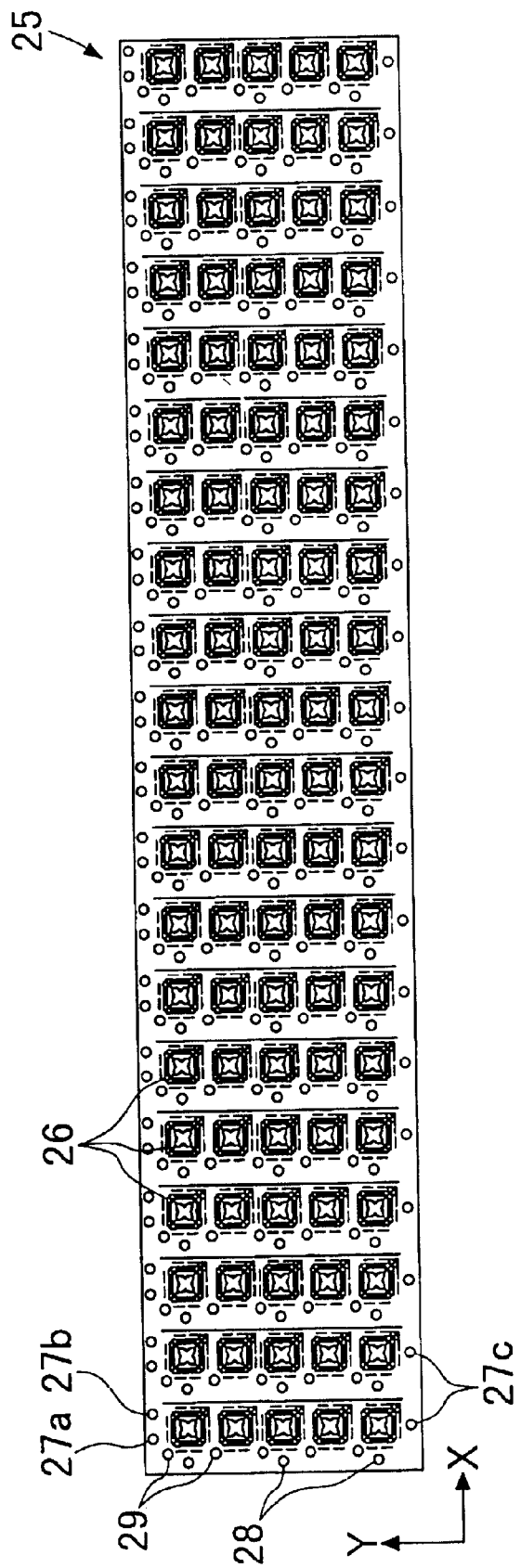
FIG. 7 is a plan view showing a leadframe used in the semiconductor device fabrication method according to the preferred embodiment 1 of the present invention.

In fabrication of the semiconductor devices 1 according to the preferred embodiment 1, a leadframe 25 having a matrix structure as shown in FIG. 7 is used. The leadframe 25 comprises a plurality of unit leadframe patterns 26, which are arranged in a matrix of 20 columns in the X direction by 5 rows in the Y direction. That is to say, 100 semiconductor devices 1 can be fabricated using one leadframe 25. On both sides of the leadframe 25, there are provided guide holes 27a, 27b and 27c to be used for transfer and positioning control of the leadframe 25.

In transfer molding, a runner is positioned at the left side of each column. For removing runner-set resin from the leadframe 25 by sticking out an ejector pin, there is provided an ejector pin hole 28 through which the ejector pin is to be driven. Further, in transfer molding, resin is run through a gate to a cavity. For removing gate-set resin cured at the gate from the leadframe 25 by sticking out an ejector pin, there is provided an ejector pin hole 29 through which the ejector pin is to be driven.

Figure 8:
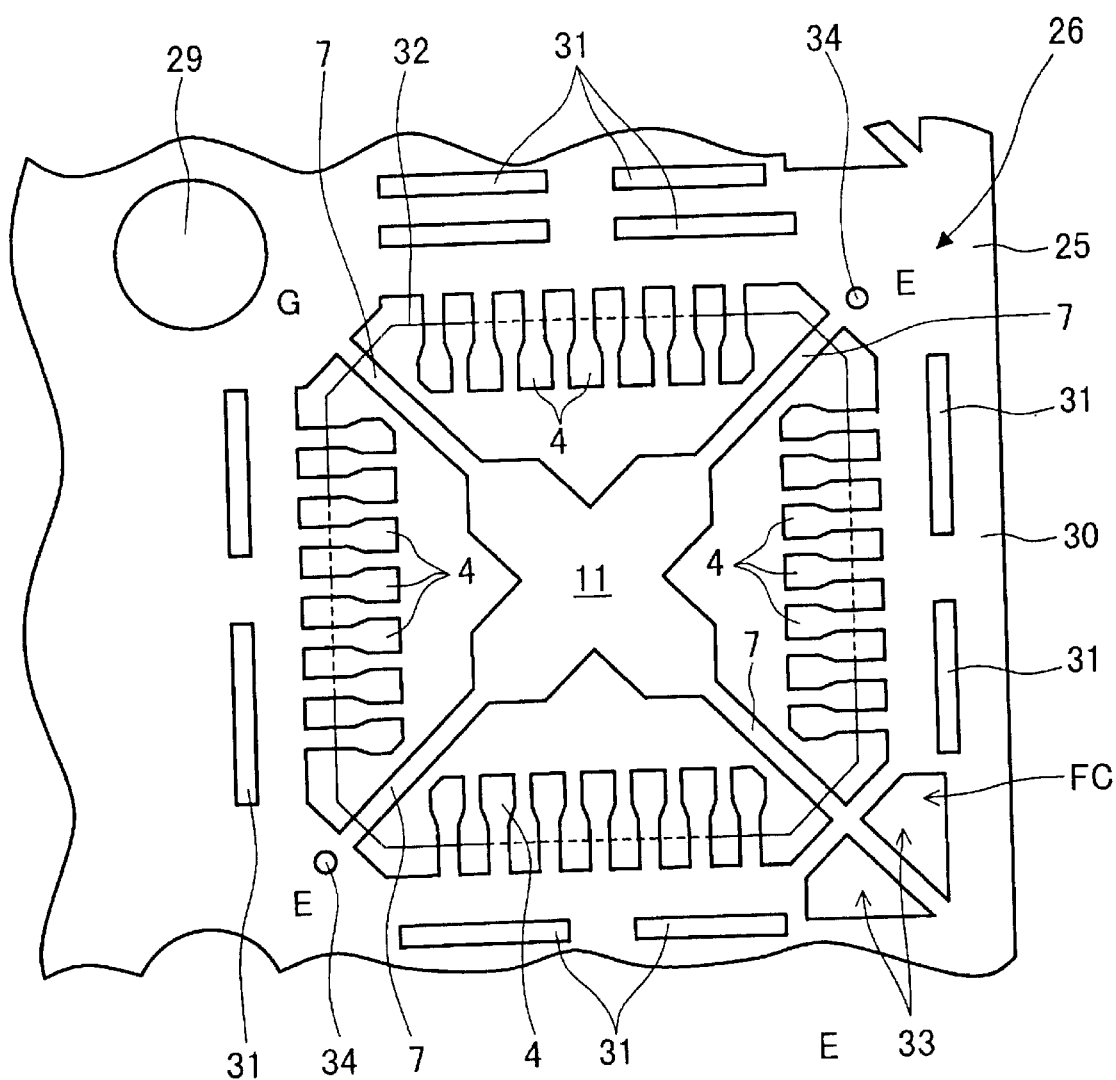
FIG. 8 is a plan view showing a unit leadframe pattern of the leadframe.

FIG. 8 shows a plan view of the unit leadframe pattern 26. The unit leadframe pattern 26 is a square pattern which comprises a frame part 30 in a quadrangular form, a plurality of leads 4 extending inward from each inner region of the frame part 30, and a plurality of tab suspension leads 7 extending inward from the four corners of the frame part 30 for supporting a tab 11 located at the center position. On each side region of the frame part 30, slits 31 are provided spacedly in the side direction to increase the elasticity of the frame part 30 supporting the leads 4.

A quadrangular area including the inner end parts of the leads 4 and the tab 11 as shown in FIG. 8 corresponds to a cavity 32 formed in a meal mold. At the upper left corner of the cavity 32, which is adjacent to the ejector pin hole 29, there is provided a gate (G) for injecting resin into the cavity 32. At the lower right corner of the cavity 32, which opposes to the gate, there is provided a flow cavity (FC) (not shown) which communicates with an air vent (E). Further, at the remaining two corners of the cavity 32, i.e., the upper right and lower left corners thereof, air vents are provided respectively (not shown).

In the preferred embodiment 1, a contact-preventive part higher than the package part 2 is formed of resin cured in the flow cavity. Further, on a region of the frame part 30 where the flow cavity (FC) is located, an opening part 33 is provided to increase adhesion between the leadframe and the contact-preventive part so that the contact-preventive part will not come off the leadframe. According to the preferred embodiment 1, two openings are provided in a symmetrical shape on both sides of a prolongation of one of the tab suspension leads 7.

At the upper right and lower left corners of the frame part 30, holes 34 are provided respectively. Each hole 34 corresponds to an air vent. In transfer molding, air-vent-set resin is engaged in the frame part 30 so that the air-vent-set resin will not come off.

Figure 10:
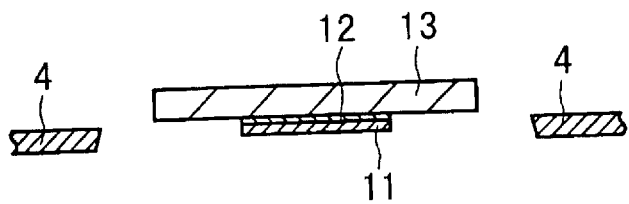
FIG. 10 is a cross-sectional view taken along line A—A in FIG. 9.
Figure 11:
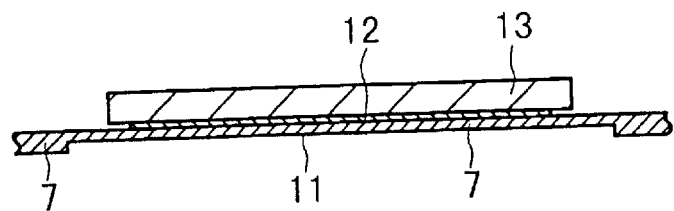
FIG. 11 is a cross-sectional view taken along line B—B in FIG. 9.

Further, as shown in FIGS. 10 and 11, the tab 11 and each tab suspension lead 7 are made thinner to a predetermined extent by means of etching (half-etching) on the back sides thereof. For example, where the leadframe is 0.2 mm thick, half-etching is performed in a depth of 0.11 mm so that the tab 11 will be 0.09 mm thick.

Through the above-mentioned process, it becomes possible to perform single-sided molding so that the tab 11 will not be exposed on the mounting face of the package part. In comparison with a structure in which each tab suspension lead is bent to provide a raised step at a midpoint thereon for embedding a tab 11 inside a package part, a half-etched structure such as described above allows the formation of a package which is thinner by an extent corresponding to the raised step at the midpoint on each tab suspension lead. Note that the top faces of the tap 11, tab suspension leads 7, and leads 4 are in the same plane.

The inner end face of each lead 4 is slanted to prevent the lead 4 from coming off the package part.

Figure 9:
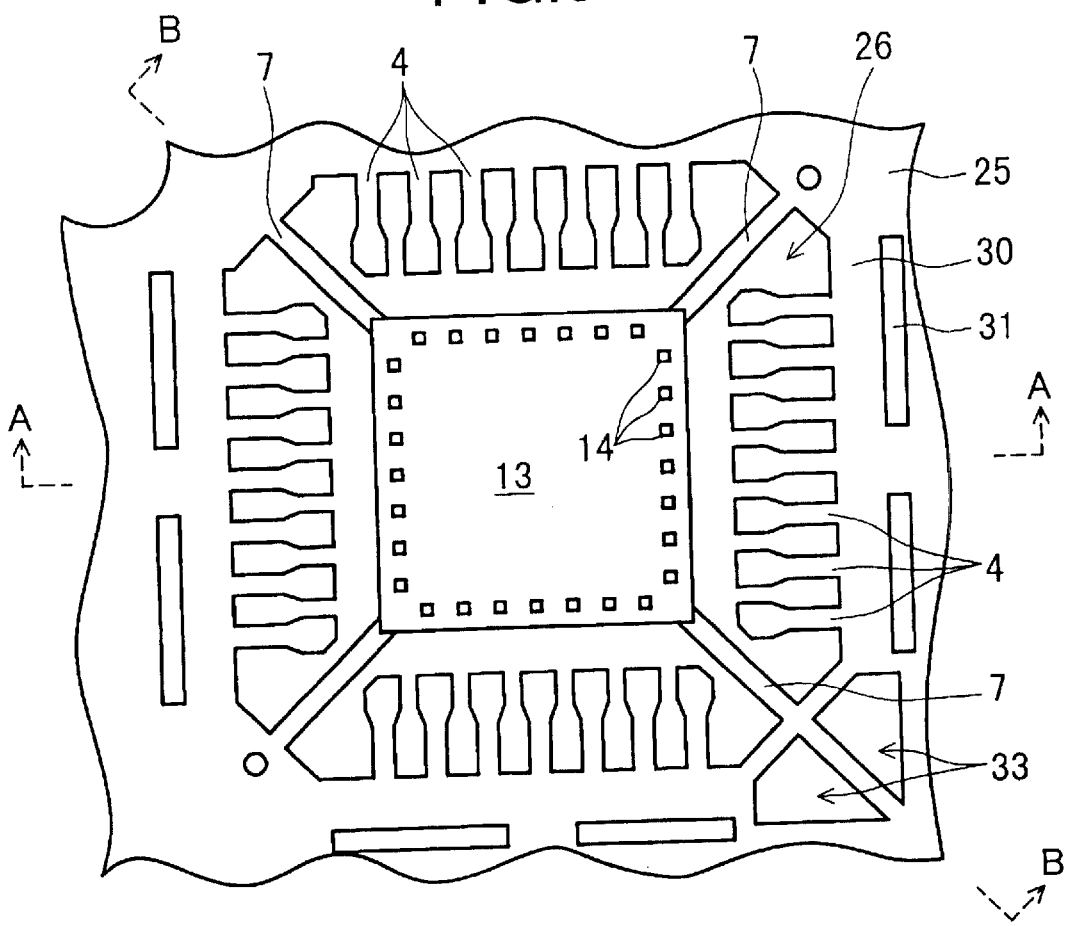
FIG. 9 is a plan view showing a state in which a semiconductor chip is secured on a unit leadframe pattern in the semiconductor device fabrication method according to the preferred embodiment 1 of the present invention.
Figure 12:
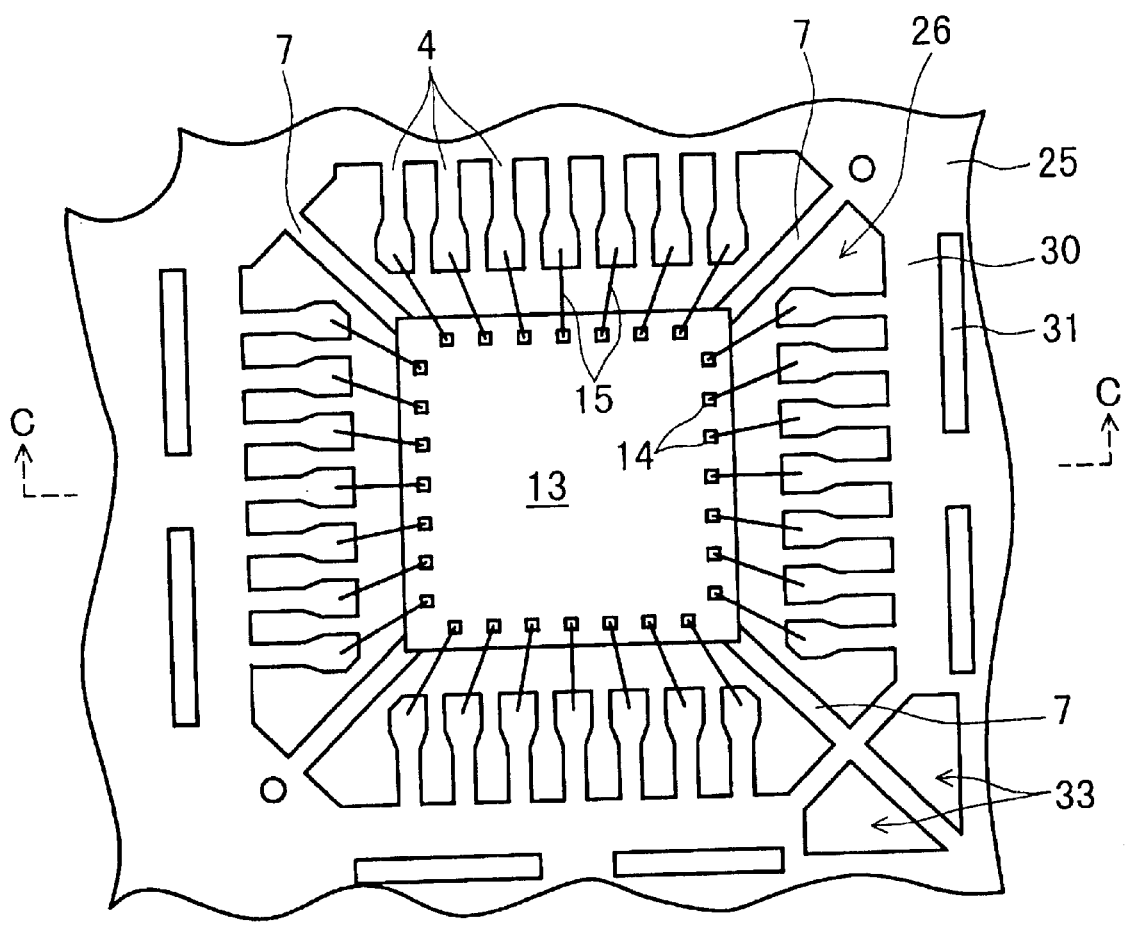
FIG. 12 is a plan view showing a state in which conductive wires are connected between electrodes of a semiconductor chip and inner lead end parts in the semiconductor device fabrication method according to the preferred embodiment 1 of the present invention.
Figure 13:
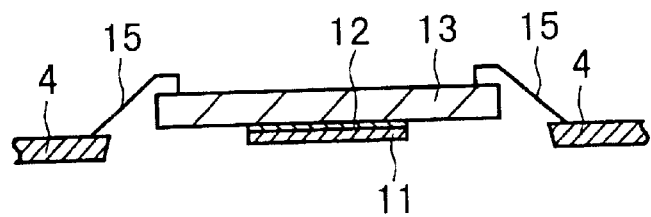
FIG. 13 is a cross-sectional view taken along line C—C in FIG. 12.
Figure 23:
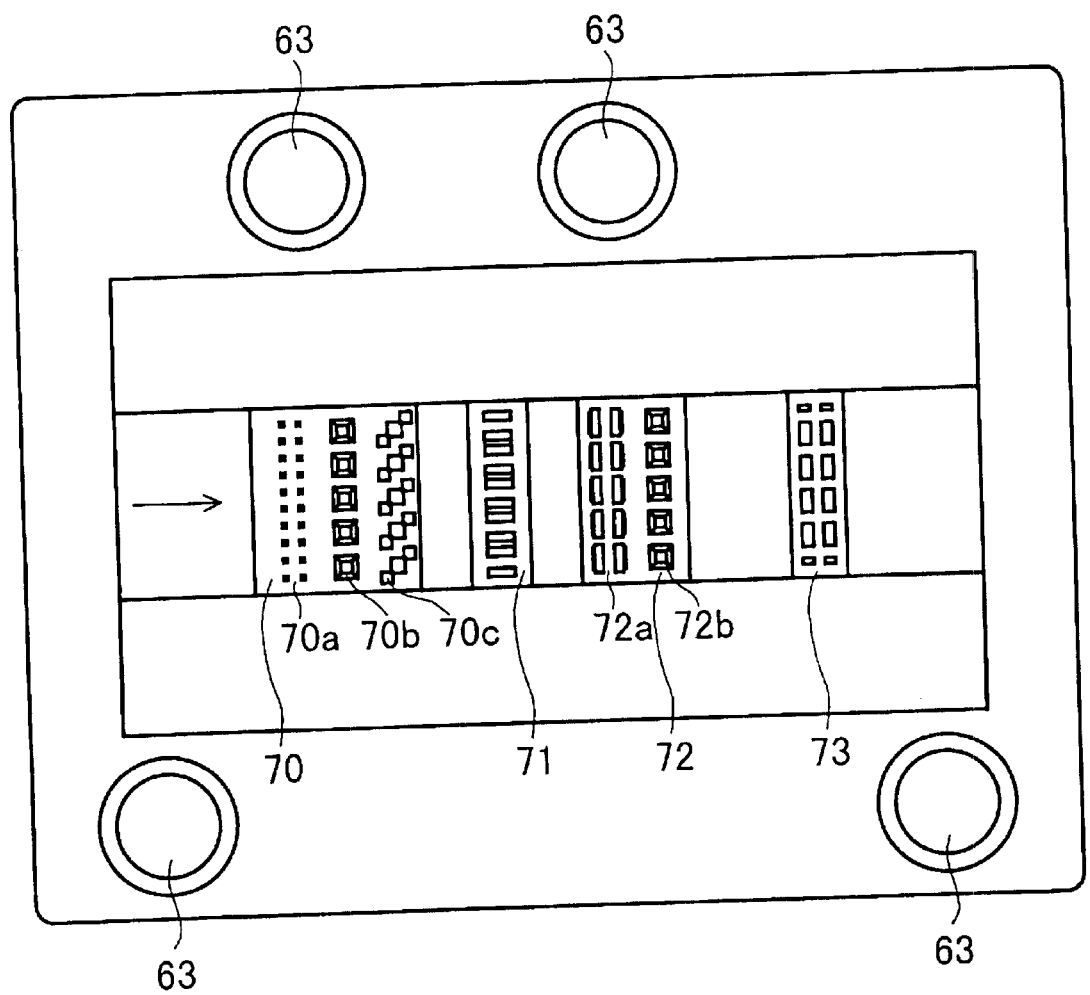
FIG. 23 is a schematic diagram showing a composite cutting die incorporated in the cutting apparatus.

The semiconductor devices 1 are fabricated using the leadframe 25 having the above-mentioned features. That is to say, the semiconductor chip 13 is secured on the tab 11 via the bonding material 12 as shown in FIGS. 9 to 11 (chip bonding: S101), and then each electrode 14 of the semiconductor chip 13 and the inner end part of each lead 4 are connected through the conductive wire 15 to provide electrical connection as shown in FIGS. 12 and 23 (wire bonding: S102).

Thereafter, on the leadframe 25 on which the semiconductor chips 13 have been assembled as mentioned above, single-sided molding is performed to form the package parts 2 (molding: S103). This process step of single-sided molding is carried out using a transfer molding apparatus.

Figure 14:
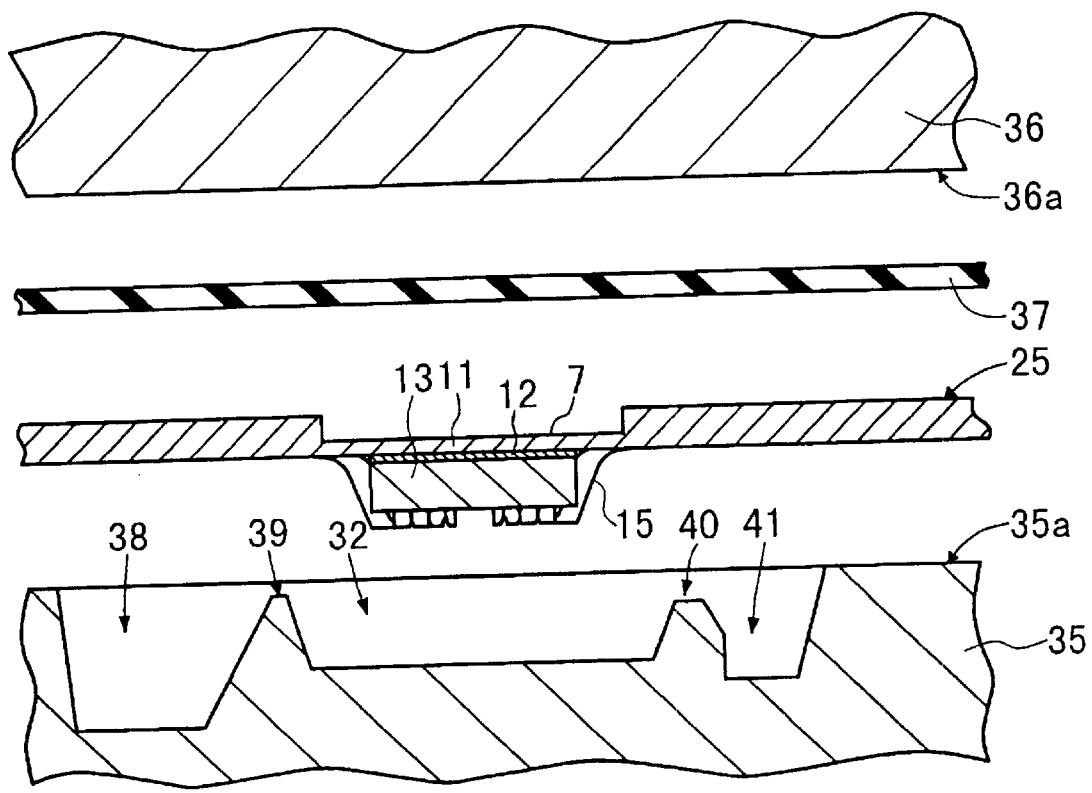
FIG. 14 is a schematic diagram showing a metal mold and a leadframe at single-sided molding in the semiconductor device fabrication method according to the preferred embodiment 1 of the present invention.

Referring to FIG. 14, there is shown a schematic diagram of a metal mold and the leadframe in single-sided molding. The metal mold, which is to be mounted on the transfer molding apparatus, comprises a lower half mold 35 and an upper half mold 36 to be placed on the lower half mold 35. The leadframe 25 on which the semiconductor chips 13 have been assembled is sandwiched between a parting face 35a of the lower half mold 35 and a parting face 36a of the upper half mold 36. Although the leadframe 25 is separated from the lower half mold 35 in FIG. 14, the leadframe 25 is set on the parting face 35a of the lower half mold 35 in actuality.

According to the preferred embodiment 1, single-sided sheet molding is performed by interleaving an elastic resin sheet 37 between the leadframe 25 and the upper half mold 36. In the single-sided sheet molding, when the leadframe 25 is sandwiched between the upper and lower half molds, the elastic resin sheet 37 is placed between the upper half mold and the leadframe. With electrode parts of the leadframe engaged in the sheet 37 by a clamping force of the upper and lower half molds, resin is injected to provide an offset form on the back side (mounting face) of the package part with respect to mounting surfaces of the electrode parts.

On the parting face 36a of the upper half mold 36, there are provided grooves partially to prevent occurrence of wrinkles on the sheet 37 though the parting face 36a is indicated as a flat face in FIG. 14. On the parting face 35a of the lower half mold 35, there are provided grooves and hollows to which molten resin is fed. In FIG. 14, a runner 38, a gate 39, a cavity 32, a through path 40, and a flow cavity 41 are arranged from left to right. On the side of the flow cavity 41, an air vent communicating therewith is disposed (not shown). Further, on the front and rear of the cavity 32, air vents are disposed respectively. For example, the cavity 32 is 0.8 to 0.9 mm deep, the flow cavity 41 is 1.1 to 1.2 mm deep, the through path 40 is 0.3 to 0.4 mm deep, and the air vent is 20 to 30 nm deep.

Figure 17:
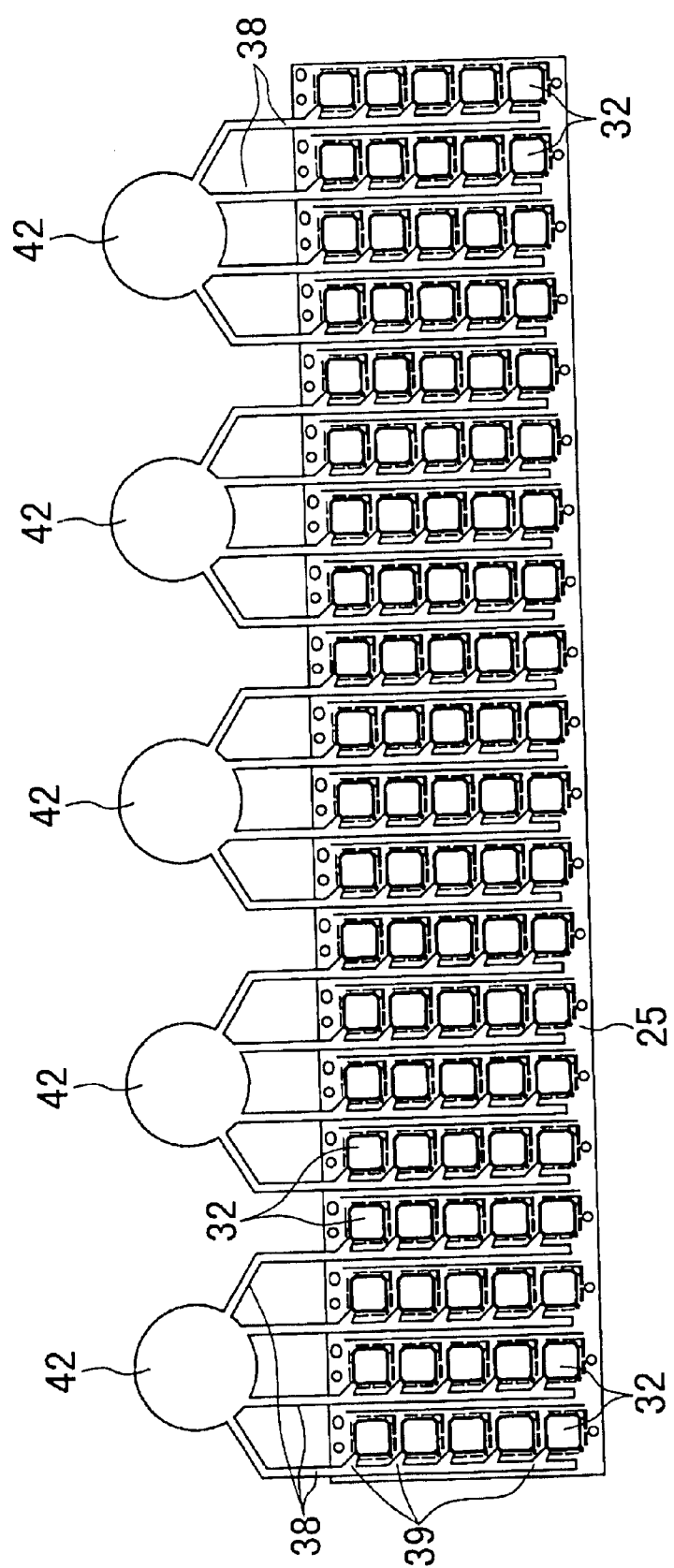
FIG. 17 is a plan view showing a relational arrangement of cavities and resin flow paths formed on a metal mold and a leadframe in the single-sided molding.

Referring to FIG. 17, there is shown a schematic plan view indicating a relational arrangement of cavities and resin flow paths formed on the metal mold and the leadframe in single-sided molding. Since the leadframe 25 has a matrix pattern of 20 columns by 5 rows, a plurality of cavities 32 are arranged in a matrix of 20 columns by 5 rows on the lower half mold 35. There are provided five pots 42 to which molding material is supplied. From each pot 42, four runners are extended, and on each runner 38, five gates 39 are disposed spacedly to feed resin to five cavities 32 arranged in the column direction.

In single-sided molding, the leadframe 25 is positioned on the parting face 35a of the lower half mold 35, and then the upper half mold 36 is set thereon for mold clamping.

Thereafter, resin is supplied to each pot 42 for heating, and then the resin heated in the pot 42 is pushed out thereof to each runner 38 by pressurization with a plunger. The resin thus pushed out of the pot 42 is fed through the runner 38 to each cavity 32 thereof. While forcing air out of the cavity 32, the resin goes into the cavity 32 so as to fill up the cavity 32. A part of the resin is fed into the flow cavity 41 over the through path 40. Since the air vents communicating with the cavity 32 and the flow cavity 41 are provided, a part of resin goes into the air vents while forcing air out of the cavity 32 and the flow cavity 41. Thus, the cavity 32 is filled with the resin without air bubbles (voids).

In the preferred embodiment 1, resin is injected into the quadrangular cavity from one gate corner thereof, and air is forced out through three air vents which are located at the corner diagonally opposite to the gate corner and at the corners on both sides with respect to the diagonal line between the gate corner and the diagonally opposite corner thereto. Thus, a symmetrical flow of resin is produced in single-sided molding. This arrangement ensures smooth escape of air from the cavity so that no air bubbles (voids) will be contained in the package part 2 to be formed.

After resin injection, a curing process is performed for resin setting. In the preferred embodiment 1, a part of resin which has been set in the runner 38 is referred to as runner-set resin 38a, a part of resin which has been set in the gate 39 is referred to as gate-set resin 39a, a part of resin which has been set in the cavity 32 referred to as package part 2, a part of resin which has been set in the through path 40 is referred to as through-path-set resin 40a, a part of resin which has been set in the flow cavity 41 is referred to as contact-preventive part 43, a part of resin which has been set in each air vent is referred to as air-vent-set resin 44, and a part of resin which has been set between the leads 4 or between each tab suspension lead 7 and its adjacent lead 4 is referred to as resin burr part 10. These parts are indicated in FIGS. 15, 16, and 18 to 21.

Figure 1:
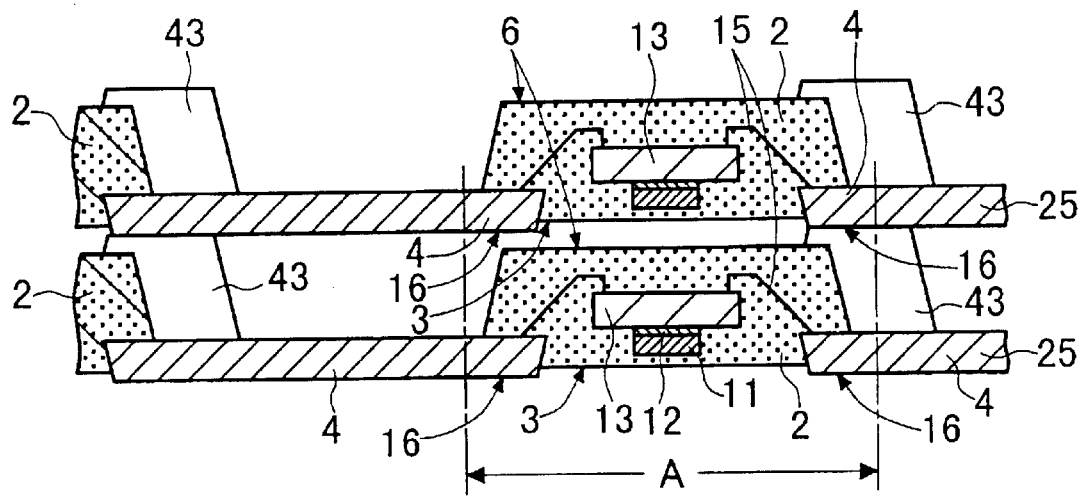
FIG. 1 is a schematic cross-sectional view showing a stack of leadframes which have been processed through single-sided molding in a semiconductor device fabrication method according to a preferred embodiment (preferred embodiment 1) of the present invention.

The contact-preventive part 43 is formed to be higher (thicker) than the package part 2 by a few mm. Therefore, as shown in FIG. 1, when the leadframes 25 which have been processed through the single-sided molding are stacked one on top of another, the leads 4 (leadframe) of a semiconductor device 1 at the upper position do not come into contact with a package part 2 of another semiconductor device 1 at the lower position since the contact-protective part 43 is located between the leadframes 25 at the upper and lower positions. This prevents occurrence of a flaw and contamination on the leads 4 of the semiconductor device 1 due to contact. In FIG. 1, reference character "A" indicates a region where the semiconductor device 1 is formed. It is therefore important to prevent occurrence of a flaw and contamination on the mounting surfaces 16 of the leads 4.

Figure 15:
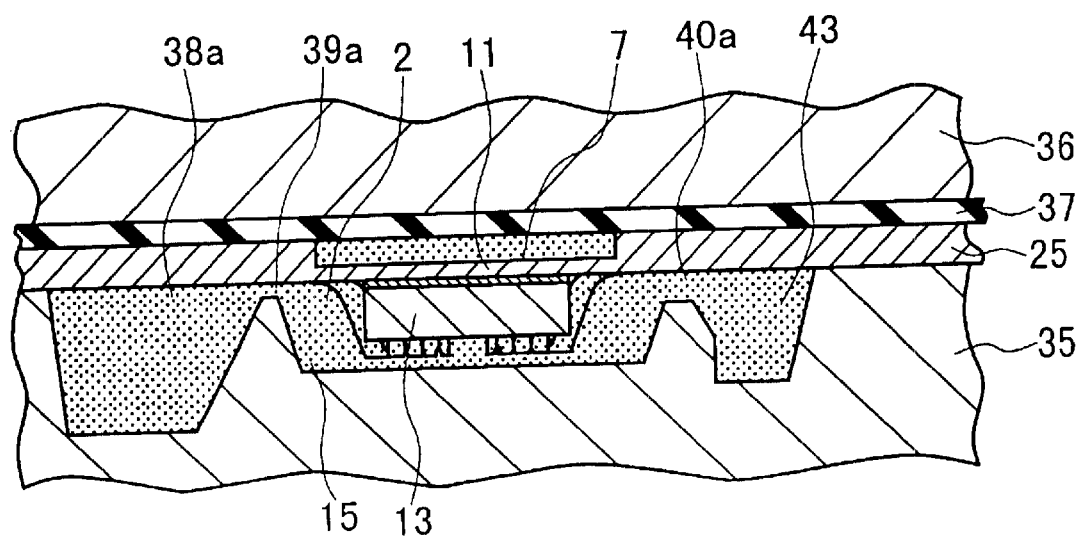
FIG. 15 is a cross-sectional view showing a package part and a contact-preventive part formed by the single-sided molding.
Figure 16:
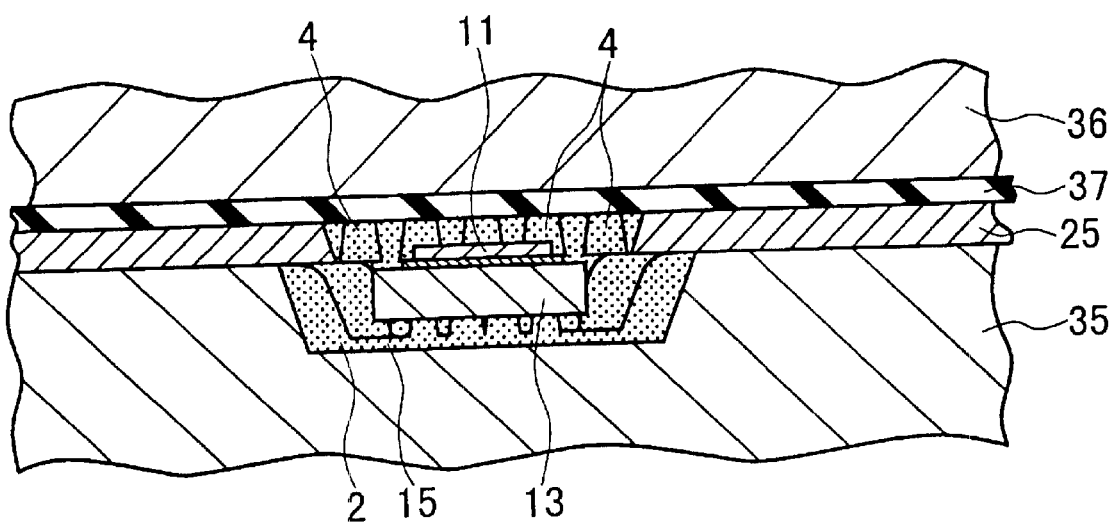
FIG. 16 is a cross-sectional view showing a package part formed by the single-sided molding.
Figure 18:
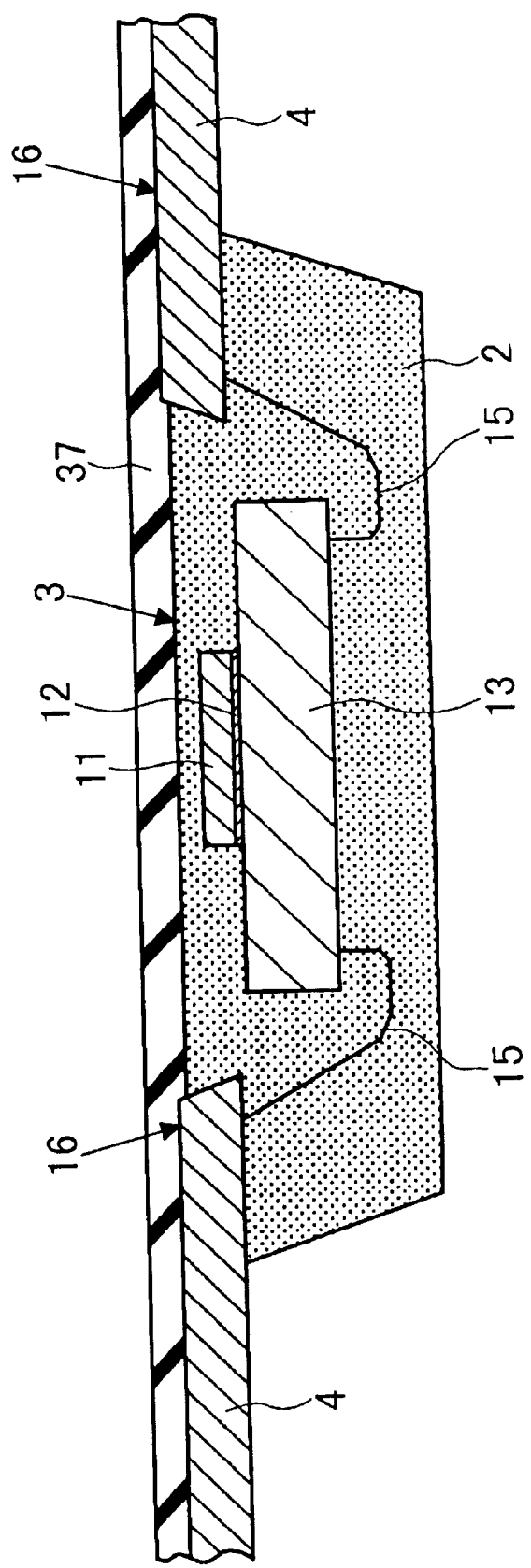
FIG. 18 is an enlarged cross-sectional view showing a relationship between a resin sheet and a package part in the single-sided molding.
Figure 19:
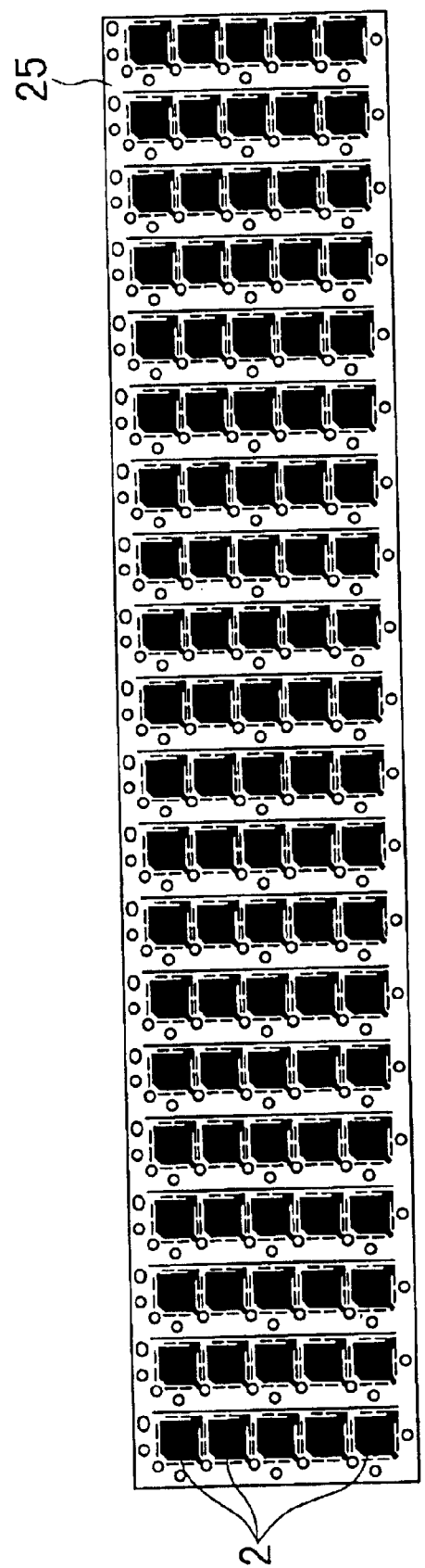
FIG. 19 is a plan view showing a leadframe on which package parts are formed by the single-sided molding.
Figure 20:
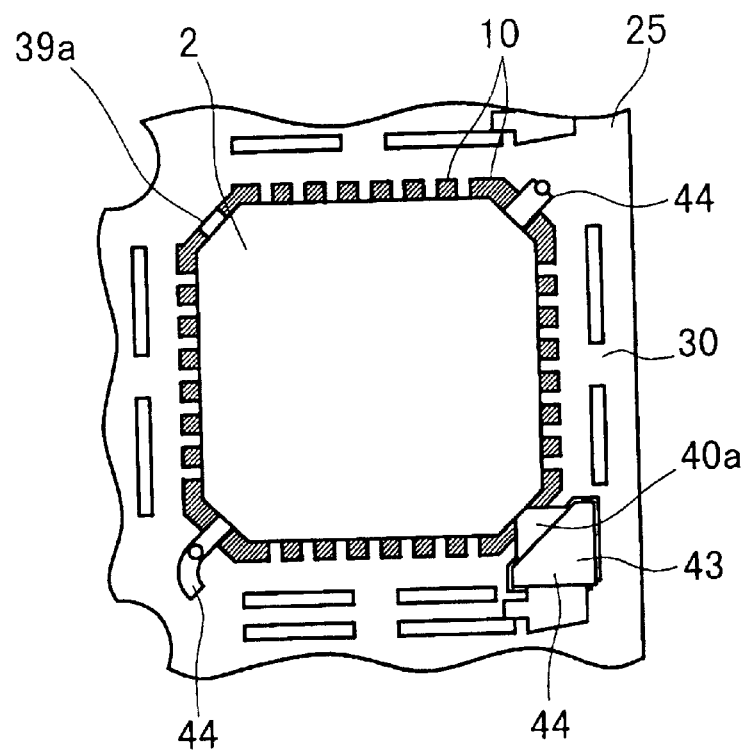
FIG. 20 is a plan view showing a unit leadframe pattern on which a package part is formed by the single-sided molding.
Figure 21:
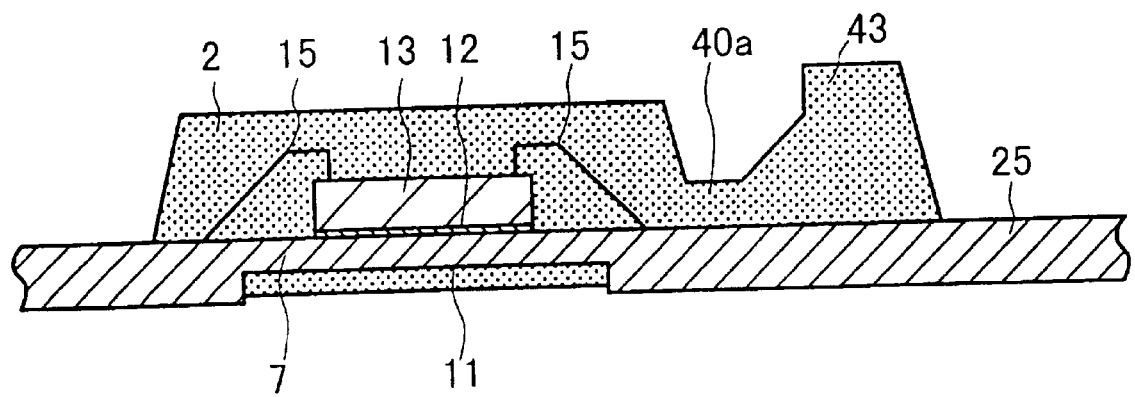
FIG. 21 is a cross-sectional view showing the package part formed on the unit leadframe pattern.

FIG. 15 shows a cross-sectional view of the package part and contact-preventive part formed by the single-sided molding, FIG. 16 shows another cross-sectional view of the package part formed by the single-sided molding, FIG. 18 shows an enlarged cross-sectional view indicating a relationship between the resin sheet and package part in the single-sided molding, FIG. 19 shows a plan view of the leadframe on which the package parts are formed by the single-sided molding, FIG. 20 shows a plan view of the unit leadframe pattern on which the package part is formed by the single-sided molding, and FIG. 21 shows a cross-sectional view of the package part formed on the unit leadframe pattern.

A pressure level of resin injected in the cavity is lower than a mold clamping load, and therefore, there is formed an offset structure in which the mounting face 3 of the package part 2 is indented from the mounting surfaces 16 of the leads 4 and tab suspension leads 7 exposed on the package mounting side as shown in FIG. 18.

After completion of the single-sided molding, plating is performed on the leads 4 and tab suspension leads 7 (S104). This process step of plating is carried out when the semiconductor device 1 is mounted. A plating film of approximately 20 to 30 μm, for example, (not shown) is formed on the surfaces of the leads 4 and tab suspension leads 7 exposed on the mounting face 3 of the package part 2. In the plating process, a Pb—Sn solder film, an Sn—Zn solder film or an Sn—Ag solder film is formed, for example. The plating film is not illustrated in particular.

Figure 24:
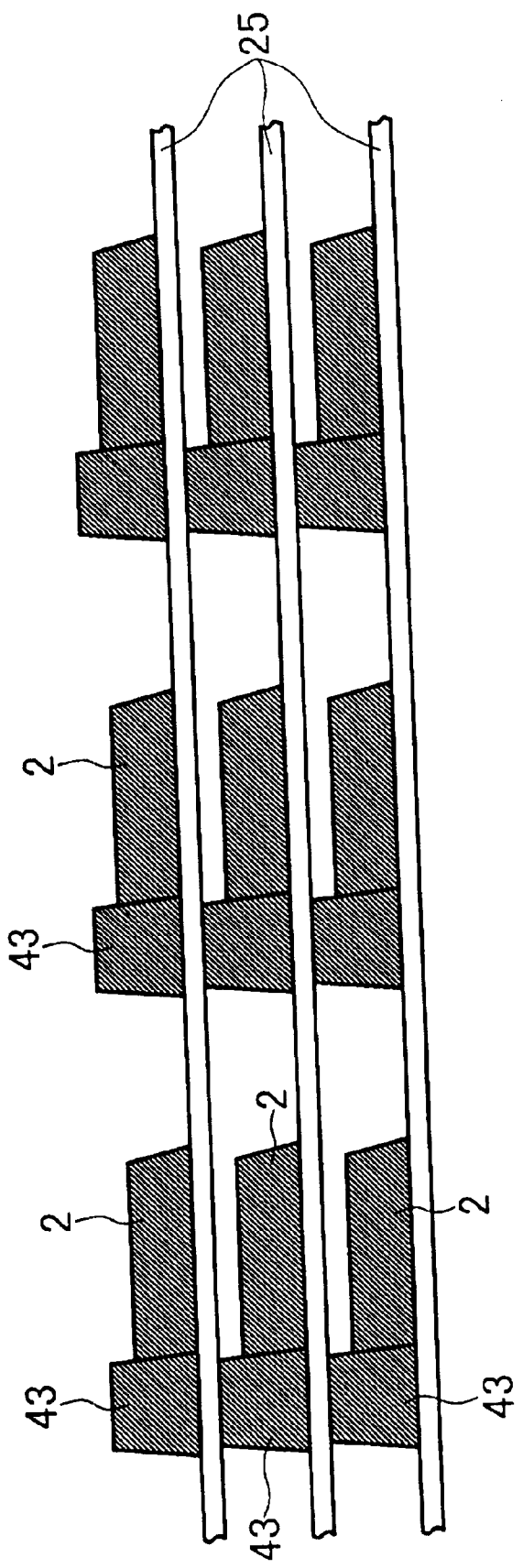
FIG. 24 is a schematic diagram showing a part of a stack of leadframes which have been processed through single-sided molding in the semiconductor device fabrication method according to the preferred embodiment 1 of the present invention.

After the single-sided molding, the leadframes 25 are stored in a state such as shown in FIG. 24. Each leadframe 25 has a matrix pattern, and the contact-preventive part 43 higher than the package part 2 is formed in the vicinity of one corner of the package part 2 on each unit leadframe pattern. Therefore, in a stack of leadframes 25 shown in FIG. 24, the contact-preventive parts 43 on the leadframe 25 located at the bottom position support the leadframe 25 located at the intermediate position, and the contact-preventive parts 43 on the leadframe 25 located at the intermediate position support the leadframe 25 located at the top position. Thus, as shown in FIG. 1, the mounting surfaces 16 of the leads 4 in the region "A" where the semiconductor device 1 is formed on a leadframe 25 located at the upper position do not come into contact with a package part 2 on another leadframe 25 located at the lower position. This arrangement prevents occurrence of a flaw and contamination on the mounting surfaces 16 of the leads 4.

Figure 22:
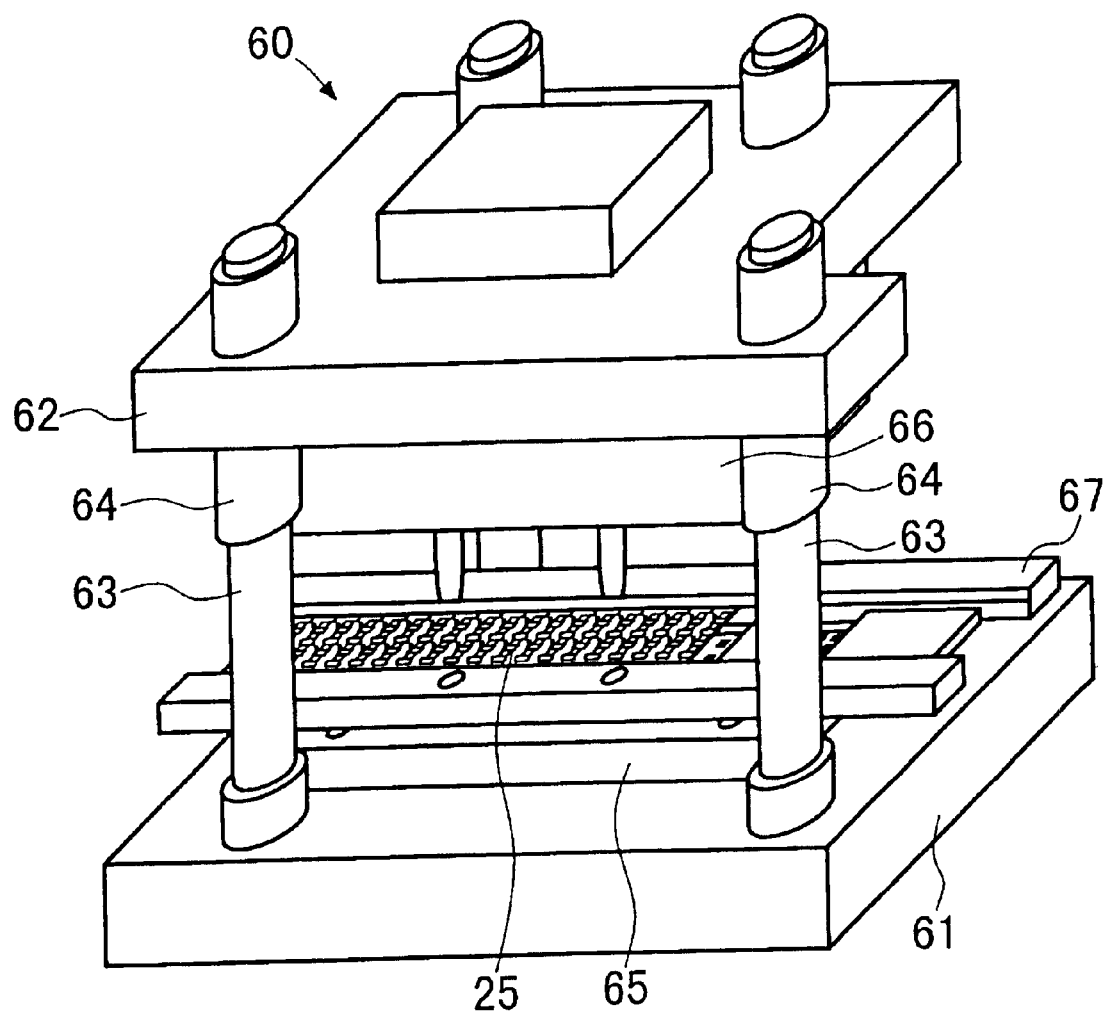
FIG. 22 is a perspective view showing a part of cutting apparatus employed in the semiconductor device fabrication method according to the preferred embodiment 1 of the present invention.

Then, as shown in FIG. 22, the following process steps are carried out on a press machine; press cutting of gate-set resin and flow-cavity-set resin (press cutting of tab suspension lead parts located thereon: S105), primary press cutting of lead tips (press cutting of leads extending in X direction: S106), secondary press cutting of lead tips (press cutting of leads extending in Y direction: S107), and press cutting of residual tab suspension leads (press cutting of air vents: S108) For these cutting process steps, a composite cutting die is used on the press machine.

Note that, at these cutting process steps, the leadframes 25 are stored and supplied in a state such as shown in FIG. 24.

FIG. 22 is a perspective view showing a cutting apparatus 60 on the press machine. The cutting apparatus 60 is equipped with a lower half mold base 61 and an upper half mold base 62. A pole 63 is provided at each of the four corners on the top side of the lower half mold base 61, and a mating part 64 which is slidably engaged with the pole 63 is provided on each of the four corners on the bottom face of the upper half mold base 62. At the center on the top side of the lower half mold base 61, there is provided a mounting part 65 for mounting a composite cutting die (not shown). At the center on the bottom side of the upper half mold base 62, there is provided a mounting part 66 for mounting a composite cutting die punch (not shown).

A guide 67 serving as a guide rail for the leadframe 25 is equipped on the mounting part 65. The leadframe 25 is turned upside down and fed along the guide 67. With the guide 67 and a transfer mechanism (not shown), the leadframe 25 is driven horizontally (from left to right) at a predetermined pitch. The leads 4 and tab suspension leads 7 are cut by driving a punch from the mounting surface side thereof so that cutting burrs will not occur at a cut-line edge on the mounting surface side while they may occur at a cut-line edge on the opposite side thereto. Thus, occurrence of a mounting defect due to cutting burrs on the leads 4 and tab suspension leads 7 can be prevented.

An elevator ram (not shown) is equipped at the center on the top side of the upper half mold base 62. The mounting part 66 is moved up/down as the elevator ram is moved up/down. In downward movement of the elevator ram, the leadframe 25 is cut at predetermined points by means of die-punch cutting.

The cutting apparatus 60 has a composite cutting die which comprises a plurality of die sections. As shown in FIG. 23, there are provided a first die section 70, a second die section 71, a third die section 72, and a fourth die section 73 in the leadframe transfer direction indicated by the arrow (from left to right).

Figure 25:
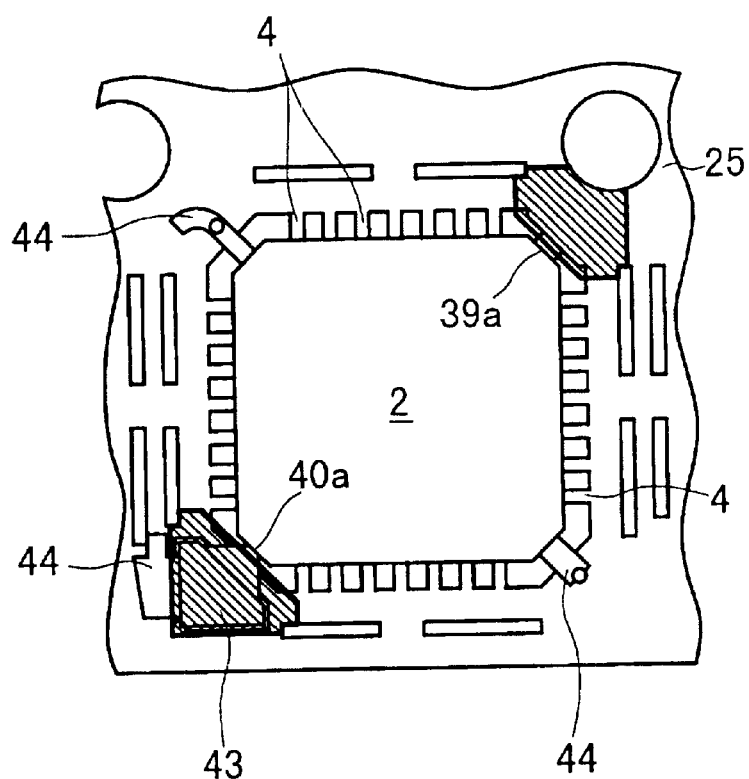
FIG. 25 is a plan view showing a gate-set resin part and a flow-cavity-set resin part on a leadframe in the semiconductor device fabrication method according to the preferred embodiment 1 of the present invention.
Figure 26:
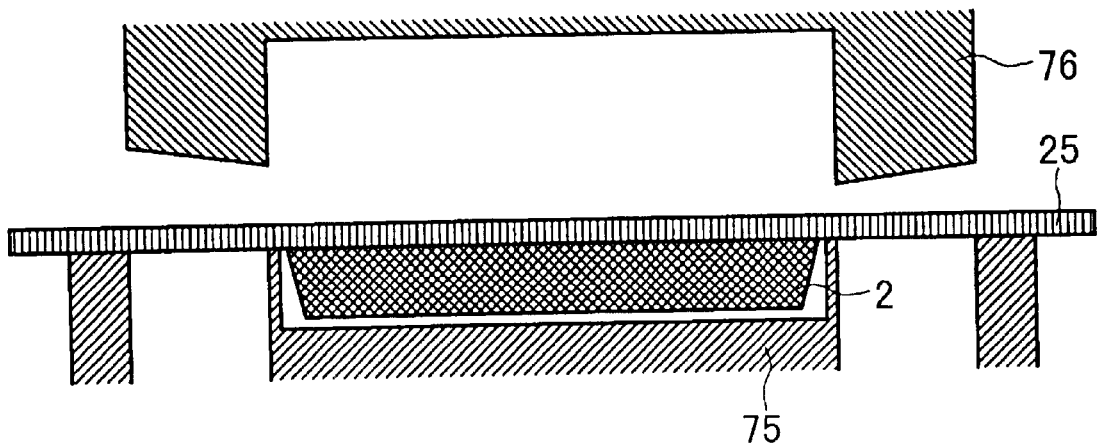
FIG. 26 is a schematic cross-sectional view showing an exemplary cutting die.

The first die section 70 contains a coining part 70a, a foreign substance guide hole part 70b, and a first cutting part 70c. The coining part 70a is used to provide coining at cutoff points on the tab suspension leads extending from the four corners of the package part 2 for the purpose of facilitating cutoff operation, the foreign substance guide hole part 70b is used to let an adhering foreign substance drop off, and the first cutting part 70c is used to cut gate-set resin and flow-cavity-set resin together with tab suspension lead parts located thereon. On the first die section 70c, regions hatched in FIG. 25 are cut off. FIG. 26 shows a schematic diagram of a die 75 and a punch 76 for cutting the leads 4 and tab suspension leads 7. In die-punch cutting, chippings drop off downward.

Figure 27:
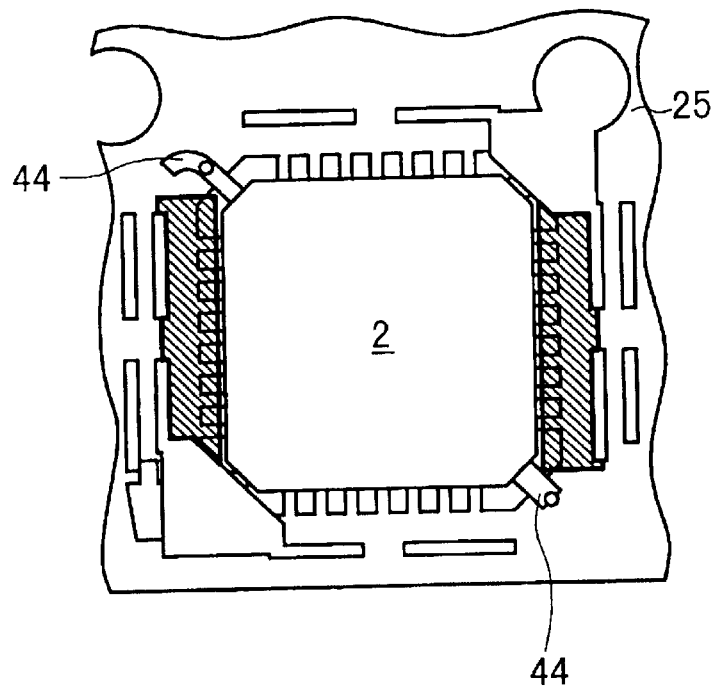
FIG. 27 is a plan view showing terminal leads disposed in the X direction of cutting on a leadframe in the semiconductor device fabrication method according to the preferred embodiment 1 of the present invention.

The second die section 71 is used for primary press cutting of lead tips. For example, the leads 4 extending in the X direction are cut. In this cutting, regions hatched in FIG. 27 are cut off.

Figure 28:
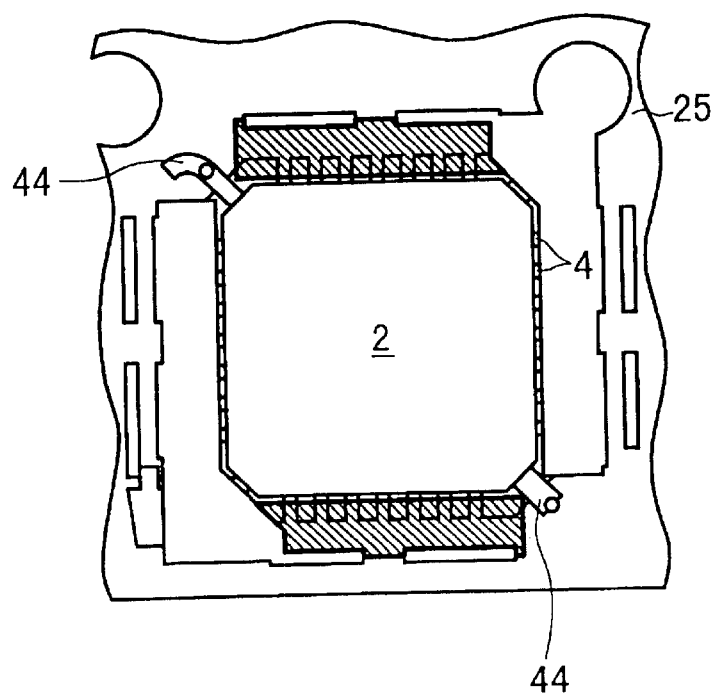
FIG. 28 is a plan view showing terminal leads disposed in the Y direction of cutting on a leadframe in the semiconductor device fabrication method according to the preferred embodiment 1 of the present invention.
Figure 29:
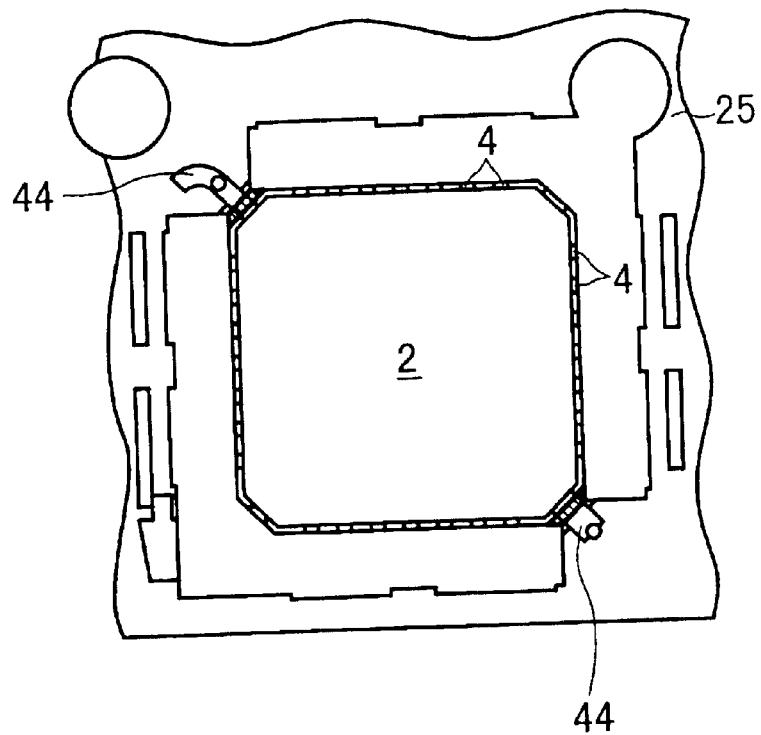
FIG. 29 is a plan view showing a punch cut part of a leadframe in the semiconductor device fabrication method according to the preferred embodiment 1 of the present invention.

The third die section 72 contains a lead cutting part 72a and a foreign substance guide hole part 72b. The lead cutting part 72a is used for secondary press cutting of lead tips, and the foreign substance guide hole part 72b is used to let an adhering foreign substance drop off. In the secondary press cutting of lead tips on the lead cutting part 72a, the leads 4 extending in the Y direction are cut, for example. In this cutting, regions hatched in the FIG. 28 are cut off.

Figure 30:
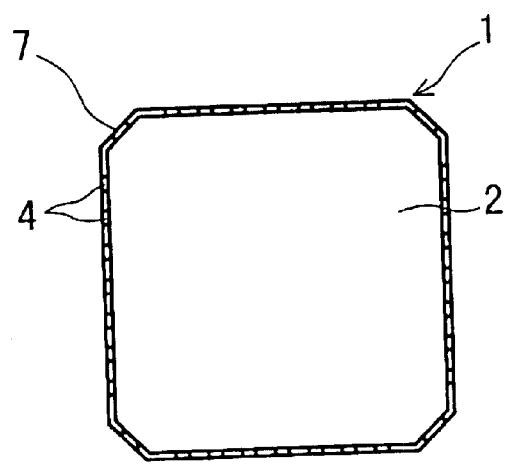
FIG. 30 is a plan view showing a semiconductor device separated from the leadframe.

The fourth die section 73 is used for cutting residual tab suspension leads 7 together with air vents located thereon. Then, the package part 2 is removed from the leadframe 25, and a non-leaded semiconductor device 1 (QFN semiconductor device 1) such as shown in FIG. 30 can thus be provided. In the above-mentioned lead cutting, the leads 4 and tab suspension leads 7 are cut off at the root region of the package part 2. A jut length of each of the leads 4 and tab suspension leads 7 is 0.1 mm or less, for example.

In the cutting of the leads 4 and tab suspension leads 7, since the leads 4 and tab suspension leads 7 are cut by means of die-punch cutting in which the punch is driven from the mounting face side of the package 2, cutting burrs will not occur at a cut-line edge on the mounting face side while they may occur at a cut-line edge on the side opposite to the mounting face side. Thus, in addition to improvement in the appearance of the non-leaded semiconductor device 1, occurrence of a mounting defect due to cutting burrs can be prevented.

Resin burrs are produced between the leads 4 and between each tab suspension lead 7 and its adjacent lead 4 in the root region of the package 2 in the molding process. These resin burrs are also cut off when the leads 4 and tab suspension leads 7 are cut. Thus, the leads 4, tab suspension leads 7, and resin burrs are trimmed in a straight line on the periphery of the package part 2.

Figure 31:
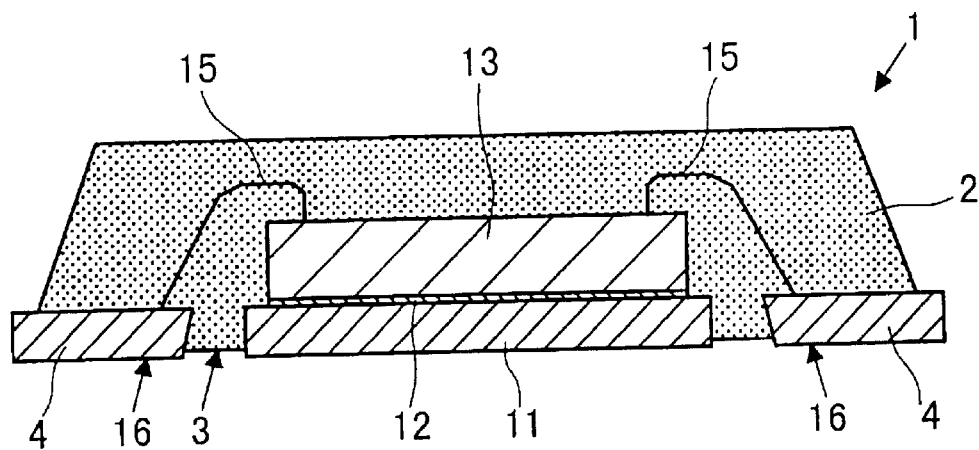
FIG. 31 is a cross-sectional view showing another semiconductor device fabricated using a flat leadframe, which has a tab, terminal leads and tab suspension leads on the same plane, in the preferred embodiment 1 of the present invention.
Figure 32:
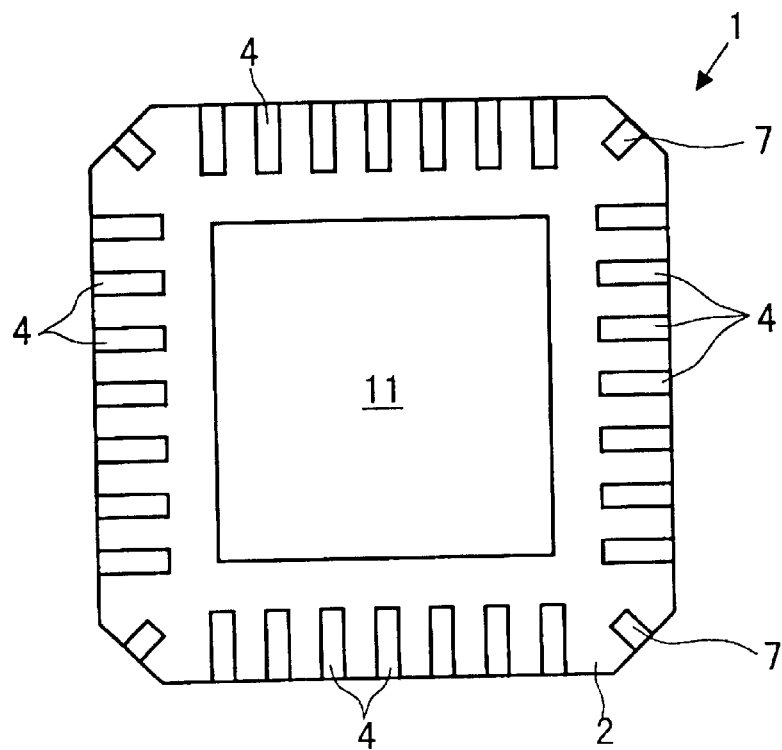
FIG. 32 is a bottom view of the semiconductor device shown in FIG. 31.

FIG. 31 shows a cross-sectional view of another semiconductor device 1 fabricated using a flat leadframe which has a tab 11, leads 4 and tab suspension leads on the same plane, and FIG. 32 shows a bottom view of the semiconductor device 1. In this structure, the tab 1 and a part of each tab suspension lead 7 are exposed on a mounting face 3 of a package part 2. When the semiconductor device 1 is mounted on a wiring board (printed circuit board), the exposed tab 11 and the exposed part of each tab suspension lead 7 serve as heat dissipation elements to quickly dissipate internal heat generated in a semiconductor chip 13 out of the package 2. This advantageous feature contributes to stable operation of the semiconductor device 1. Note that a tab-side part of each tab suspension lead 7 is thinned by half-etching. Therefore, the thinned part of each tab suspension lead 7 is not exposed on the mounting face 3 of the package 2.

Figure 33:
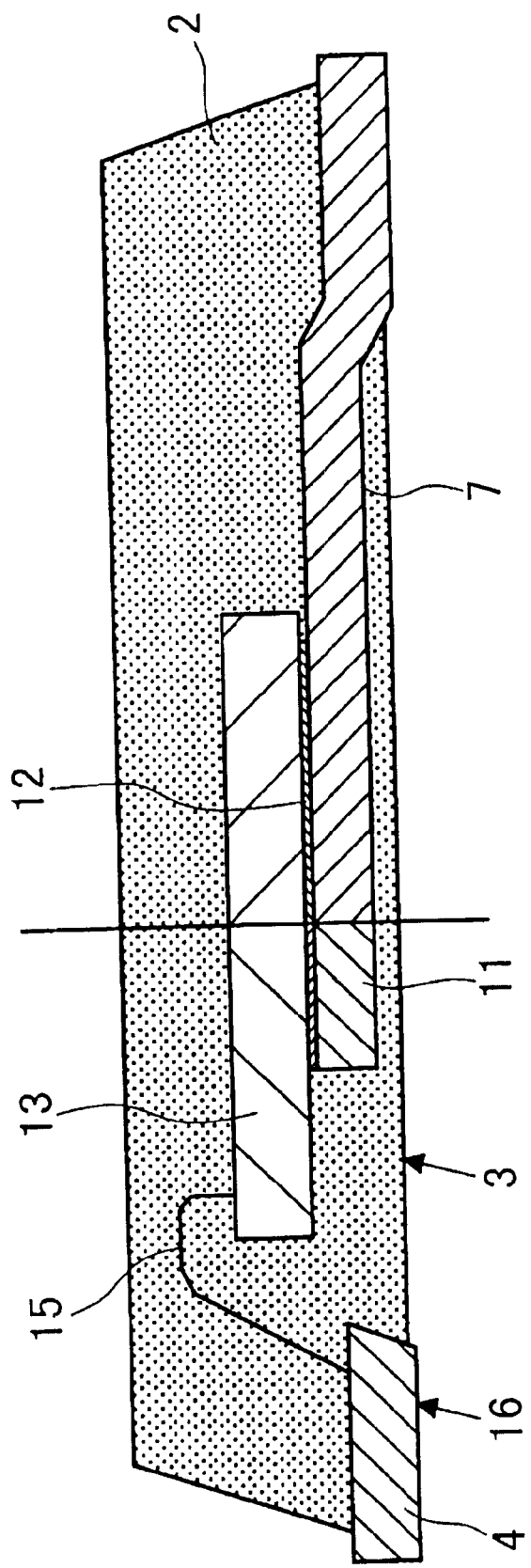
FIG. 33 is a cross-sectional view showing another semiconductor device fabricated using a non-flat leadframe, which has each tab suspension lead bent to provide a raised step at a midpoint thereon, in the preferred embodiment 1 of the present invention.
Figure 34:
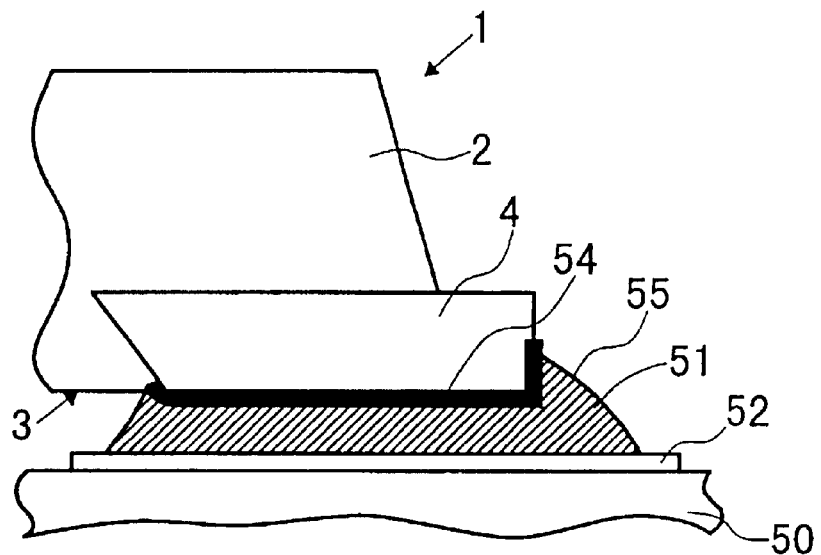
FIG. 34 is a partial cross-sectional view of a non-leaded semiconductor device in a good mounting condition.
Figure 35:
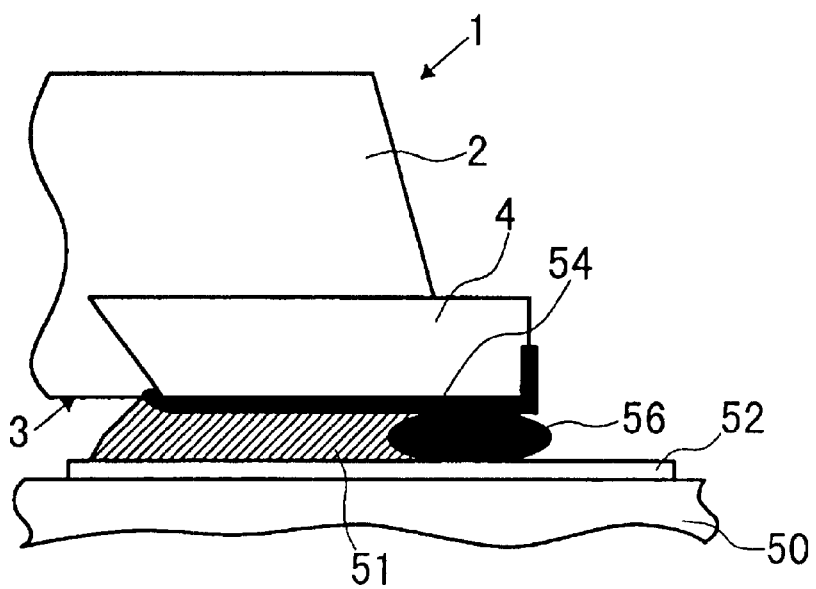
FIG. 35 is a partial cross-sectional view of a non-leaded semiconductor device in a defective mounting condition due to adhesion of a foreign substance.
Figure 36:
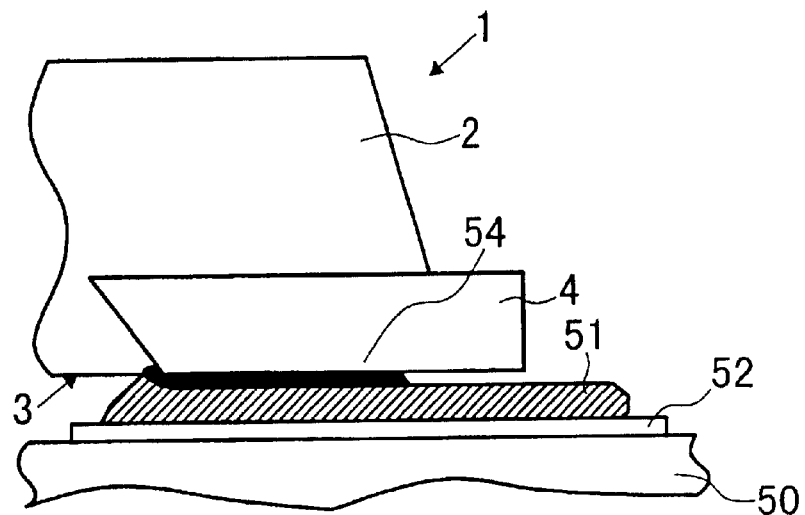
FIG. 36 is a partial cross-sectional view of a non-leaded semiconductor device in a defective mounting condition due to partial missing of a plating film.

FIG. 33 shows a cross-sectional view of a QFN semiconductor device 1 fabricated using a non-flat leadframe which has each tab suspension lead 7 bent to provide a raised step at a midpoint thereon. In this figure, different sections are shown on the left and right sides with respect to the center line for the purpose of easy understanding of the structural arrangement.

According to the preferred embodiment 1, the following advantageous effects can be provided:

(1) Information of the package part 2, the contact-preventive part thicker than the package part 2 is formed outside the package part 2. Therefore, when the leadframes 25 which have been processed through the single-sided molding are stacked one on top of another, external electrode terminals of a leadframe 25 at the upper position do not come into contact with a package part 2 of another leadframe 25 at the lower position since the contact-preventive part 43 is located between the leadframes 25 at-the upper and lower positions, preventing occurrence of a flaw and contamination on the external electrode terminals of the leadframe 25 at the upper position. Thus, a non-leaded semiconductor device having high reliability in mounting can be provided. That is to say, the mounting reliability of the semiconductor device 1 is improved since a plating film on the surface of each external electrode terminal thereof is neither flawed nor contaminated.

(2) Since just one contact-preventive part 43 is formed per package part, the amount of resin to be injected does not increase substantially even where the matrix-type leadframe 25 is used. It is therefore not required to increase a pressure of resin injection, thus not causing particular difficulty in transfer molding. Further, it is possible to use a conventional transfer molding apparatus without modification.

(3) Since the amount of resin to be injected for transfer molding does not increase substantially as mentioned in the above item (2), a possible defect of short-circuiting due to deformation of a conductive wire 15 in a flow of resin will not occur at a distant cavity to which resin is fed through a runner, thus contributing to improvements in yield and reliability.

(4) Since just one contact-preventive part 43 is formed per package part as mentioned in the above item (2), it is not required to substantially increase the size of each unit leadframe pattern, thus contributing to efficient use of the leadframe 25.

(5) At the step of cutting the leads 4 and tab suspension leads 7, since the leads 4 and sub suspension leads 7 are cut by means of die-punch cutting in which the punch is driven from the mounting face side of the package part 2, cutting burrs will not occur at a cut-line edge on the mounting face side. Thus, in addition to improvement in the appearance of the non-leaded semiconductor device 1, it is possible to prevent occurrence of a mounting defect due to cutting burrs.

(6) Since the tab 11 and the tab-side part of each tab suspension lead 7 are half-etched, the top face of the tab 11 on which the semiconductor chip 13 is secured and the top face of each lead 4 on which each conductive wire 15 is connected are positioned in the same plane. In comparison with a structure in which each tab suspension lead 7 is bent to provide a raised step at a midpoint, the above half-etched structure allows the formation of a package (semiconductor device 1) which is thinner by an extent corresponding to the raised step at the midpoint on each tab suspension lead.

(7) The advantageous effects mentioned in the above items (1) to (6) make it possible to reduce the cost of semiconductor device fabrication.

Figure 37:
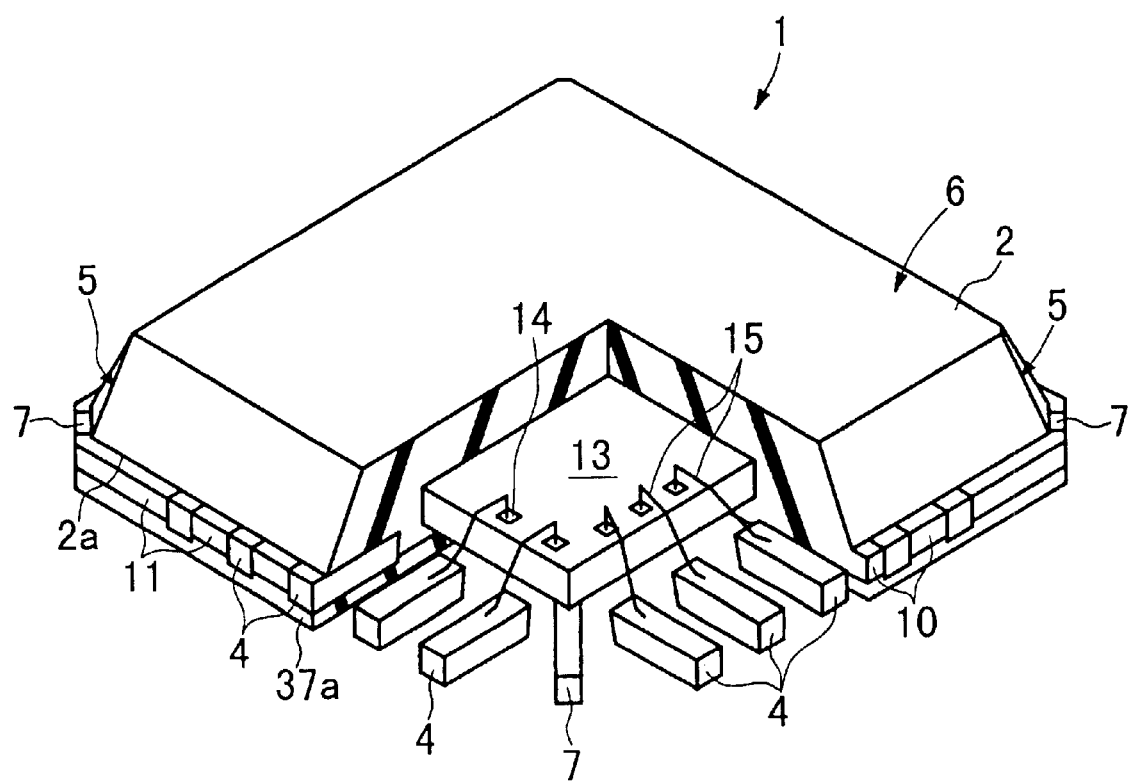
FIG. 37 is a schematic perspective view of a semiconductor device fabricated in a semiconductor device fabrication method according to another preferred embodiment (preferred embodiment 2) of the present invention, showing a cutaway section thereof.
Figure 38:
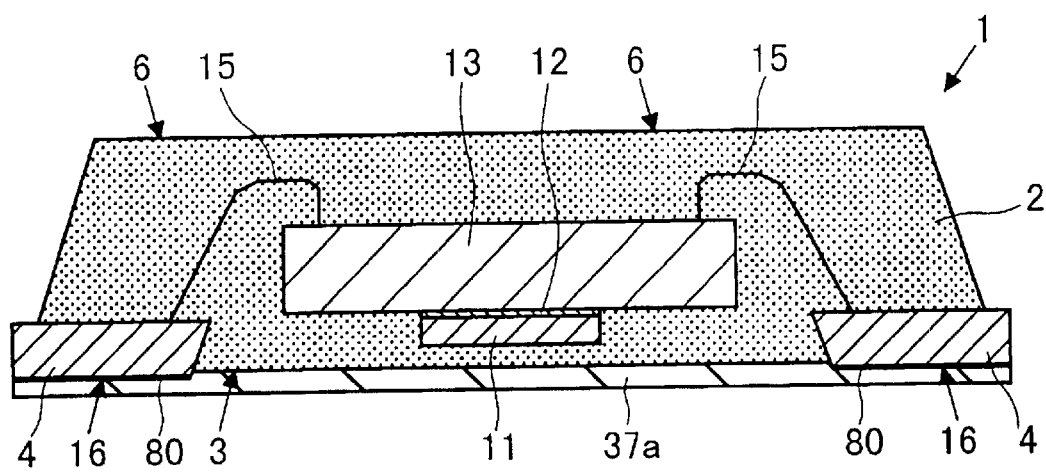
FIG. 38 is a cross-sectional view of the semiconductor device fabricated in the semiconductor device fabrication method according to the preferred embodiment 2 of the present invention.
Figure 39:
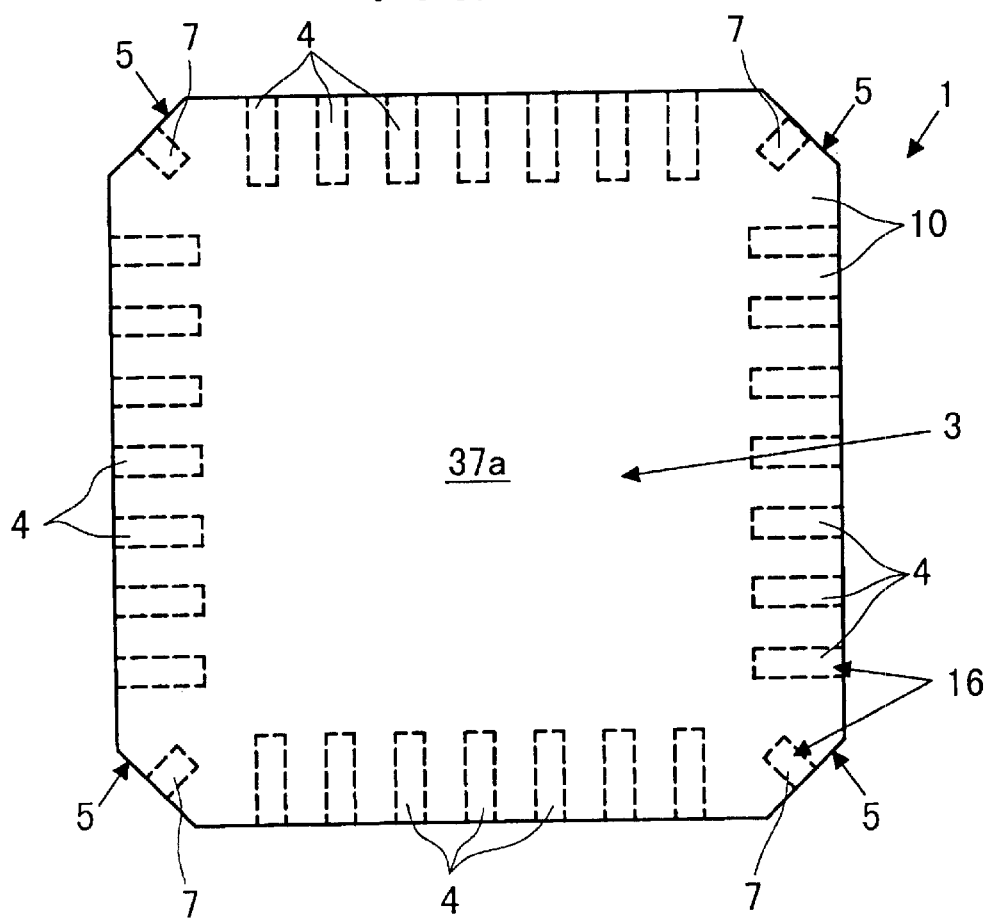
FIG. 39 is a bottom view of the semiconductor device fabricated in the semiconductor device fabrication method according to the preferred embodiment 2 of the present invention.

Embodiment 2:

FIGS. 37 to 53 are concerned with a semiconductor device fabrication method according to another preferred embodiment (preferred embodiment 2) of the present invention. A non-leaded (QFN) semiconductor device 1 fabricated by the semiconductor device fabrication method according to the preferred embodiment 2 is structured as shown in FIGS. 37 to 39. FIG. 37 is a-perspective view of the semiconductor device 1, showing a cutaway section thereof. FIG. 38 shows a cross-sectional view of the semiconductor device 1, and FIG. 39 shows the bottom view thereof.

In comparison with the non-leaded semiconductor device 1 in the preferred embodiment 1, the QFN semiconductor device 1 in the preferred embodiment 2 is characterized by a structure that a mounting face 3 of a package part 2 is covered with a sheet 37a used at the time of transfer molding. In terms of structural features, the other parts of the semiconductor device 1 in the preferred embodiment 2 are the same as those of the semiconductor device 1 in the preferred embodiment 1. The sheet 37a is disposed on the entire area of the mounting face 3 of the package part 2, and the periphery of the sheet 37a meets the peripheral cut-line edges of leads 4. The periphery of the sheet 37a also meets the peripheral cut-line edges of resin burr parts 10 each being disposed between the leads 4 and the peripheral cut-line edges of resin burr parts 10 each being disposed between a tab suspension lead 7 and its adjacent lead 3.

Thus, the exposed parts of the leads 4 and tab suspension leads 7 on the mounting face 3 are covered with the sheet 37a to provide protection. Therefore, the surfaces of the leads 4 and tab suspension leads 7 will not be flawed or contaminated with a foreign substance.

In the semiconductor device 1 according to the preferred embodiment 2, a plating film 80 is formed on the surfaces of the leads 4 and tab suspension leads 7. The plating film 80, though not limited in particular, may be a Pb—Sn solder film, an Sn—Zn solder film, an Sn—Ag solder film, or a palladium film not containing Pb, for example.

Therefore, until the sheet 37a is removed, the plating film 80 formed on the leads 4 and tab suspension leads 7 will not be flawed or contaminated with a foreign substance. With the sheet 37a removed, the semiconductor device 1 is mounted on a wiring board as shown in FIG. 5 in the same fashion as for the preferred embodiment 1. If the semiconductor device 1 is mounted on a wiring board for an electronic apparatus immediately after removal of the sheet 37a therefrom, connections of the leads 4 and tab suspension leads 7 on the wiring board can be made securely with high reliability. This allows production of an electronic apparatus having excellent quality and high reliability.

Then, the following describes details of semiconductor device fabrication processes in the preferred embodiment 2. FIGS. 40 to 53 are concerned with the semiconductor device fabrication processes according to the preferred embodiment 2.

Figure 40:
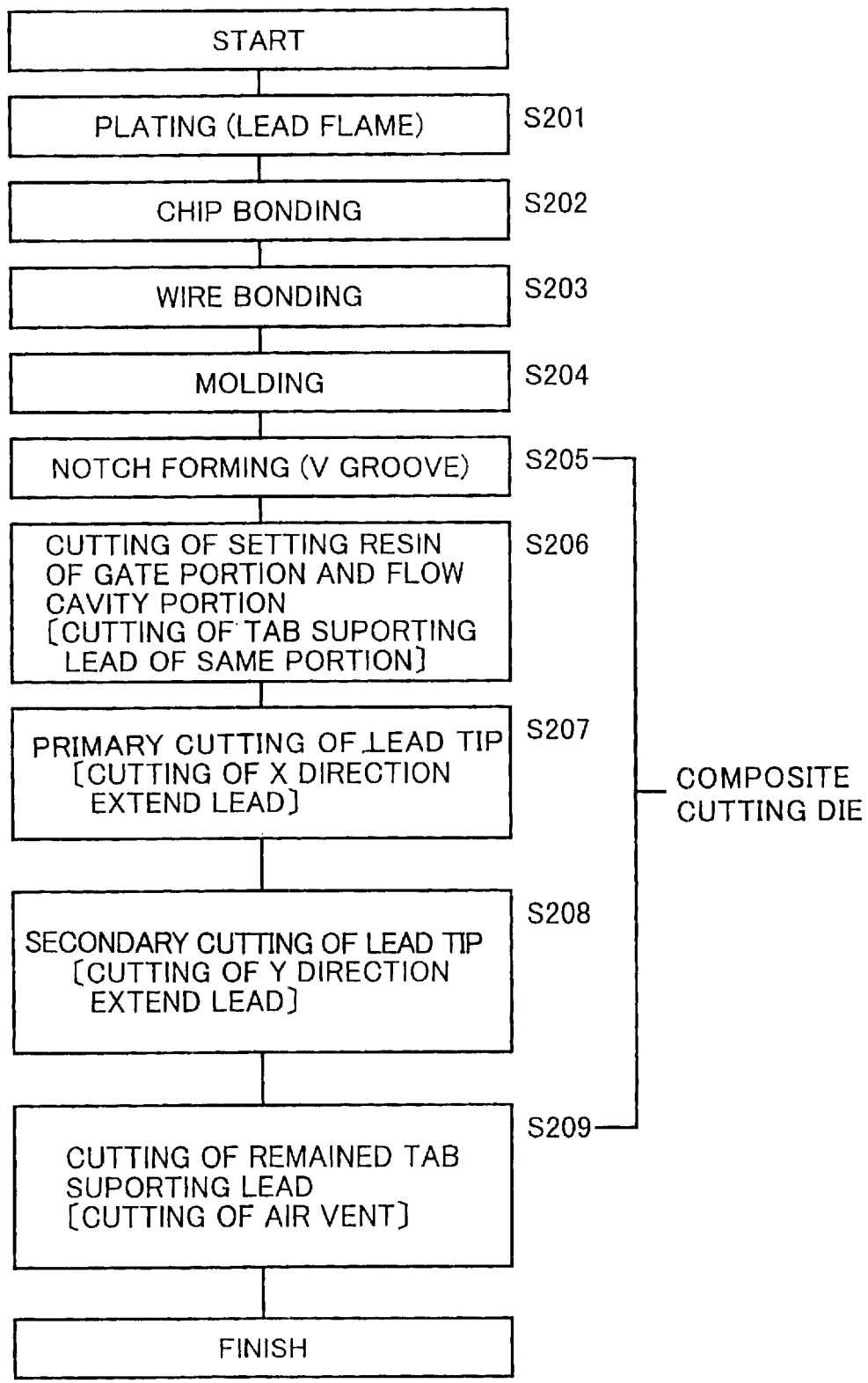
FIG. 40 is a flowchart showing the semiconductor device fabrication method according to the preferred embodiment 2 of the present invention.

Referring to FIG. 40, there is shown a flowchart of the method of fabricating QFN semiconductor devices according to the preferred embodiment 2. The semiconductor device 1 is fabricated through process steps 201 to 209.

More specifically, after the start of semiconductor device fabricating operation, the following process steps are carried out; selective plating on leadframe (S201), chip bonding (S202), wire bonding (S203), molding (S204), notch forming (S205), press cutting of gate-set resin and flow-cavity-set resin (S206), primary press cutting of lead tips (S207), secondary press cutting of lead tips (S208), and press cutting of residual tab suspension leads (S209). At each of the steps of notch forming (S205), press cutting of gate-set and flow-cavity-set resin (S206), primary press cutting of lead tips (S207), secondary press cutting of lead tips (S208), and press cutting of residual tab suspension leads (S209), resin/lead cutting is performed using a composite cutting die.

In the preferred embodiment 2, notch forming (S205) is included in the process of lead cutting with the composite cutting die. In the notch forming, a V groove is formed at a point to be cut on each tab suspension lead 7 protruding from the periphery of the package part 2 for the purpose of ensuring satisfactory cutting performance. Thereafter, at the time of cutting the tab suspension leads 7, a stress is concentrated onto the bottom of the V groove to facilitate cutting. A notch forming part (not shown) is provided in the first section of the composite cutting die. The notch forming part comprises a die part having a V groove on which each tab suspension lead 7 is to be set and a punch part having a V shape tip corresponding to the V groove of the die part. In notch formation, each tab suspension lead 7 is sandwiched between the punch and die parts so that a V groove is formed across the width of the tab suspension lead 7. It is to be understood that the shape of the notch is not limited to "V" and that any other notch shape may be used for improvement in cutting performance.

In comparison with the preferred embodiment 1, the preferred embodiment 2 is characterized by the following features:

(1) A plating film is formed selectively on a leadframe before chip bonding;
(2) Notch forming is carried out at the first step in cutting process using a composite cutting die;
(3) An adhesive sheet is used in transfer molding, and the sheet is held on a mounting face of each package part even after terminal leads and tab suspension leads are cut; and
(4) The sheet is removed from each semiconductor device before it is mounted on a wiring board.

In the following description, similar process steps to those in the preferred embodiment 1 are not discussed.

Figure 41:
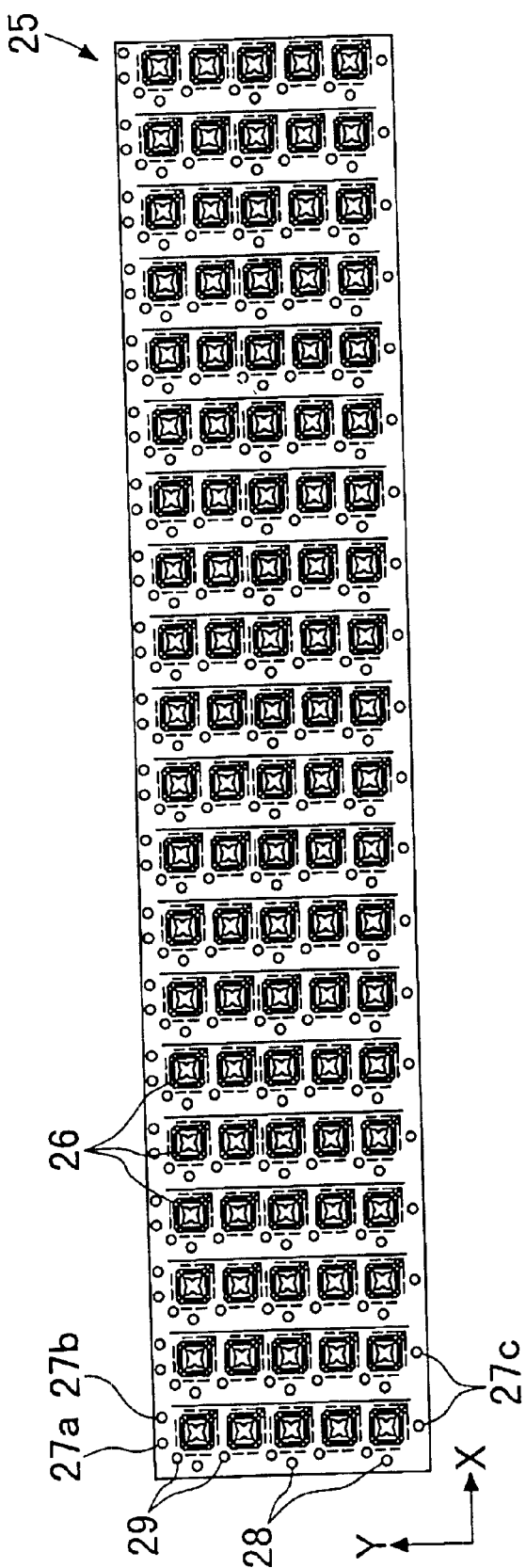
FIG. 41 is a plan view showing a leadframe used in the semiconductor device fabrication method according to the preferred embodiment 2 of the present invention.

In fabrication of the semiconductor device 1 according to the preferred embodiment 2, a leadframe 25 having a matrix structure as shown in FIG. 41 is used as in the case of the preferred embodiment 1.

Figure 42:
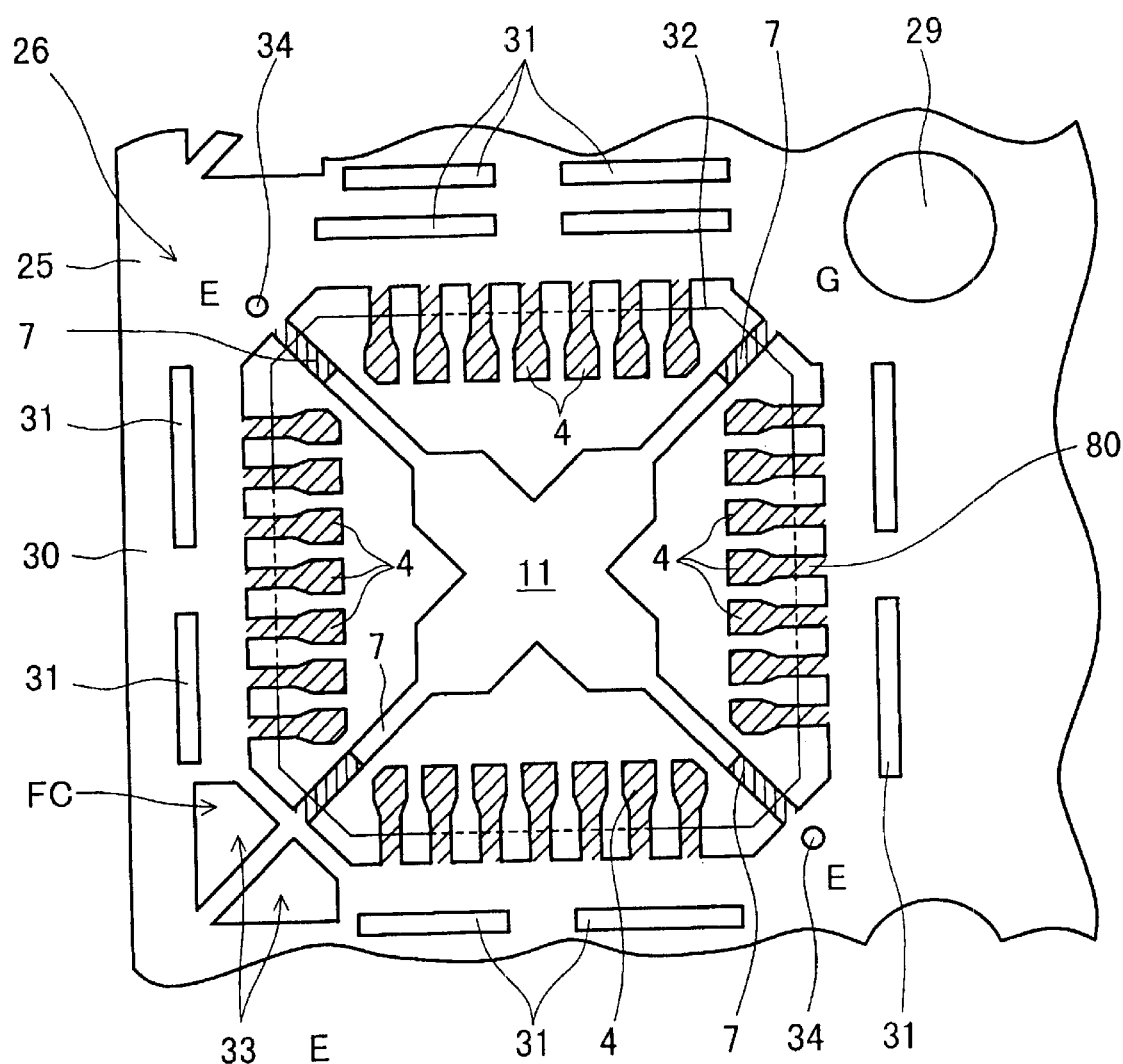
FIG. 42 is a bottom view showing the bottom side of a unit leadframe pattern on the leadframe.

As shown in FIG. 42, plating is provided on mounting surfaces of the leads 4 and tab suspension leads 7 to form a plating film 80 on each of the mounting surfaces thereof (plating: S201). In FIG. 42, each region on which the plating film is formed is indicated by hatching. The plating film 80, though not limited in particular, may be a Pb—Sn solder film, an Sn—Zn solder film, an Sn—Ag solder film, or a palladium film not containing Pb, for example. FIG. 42 shows a bottom view of the leadframe 25. Each tab 11 and a tab-side part of each tab suspension lead 7 are thinned by half-etching on the bottom sides thereof. Since the regions corresponding to these thinned parts are to be covered with a package part, a plating film is not formed thereon.

Figure 43:
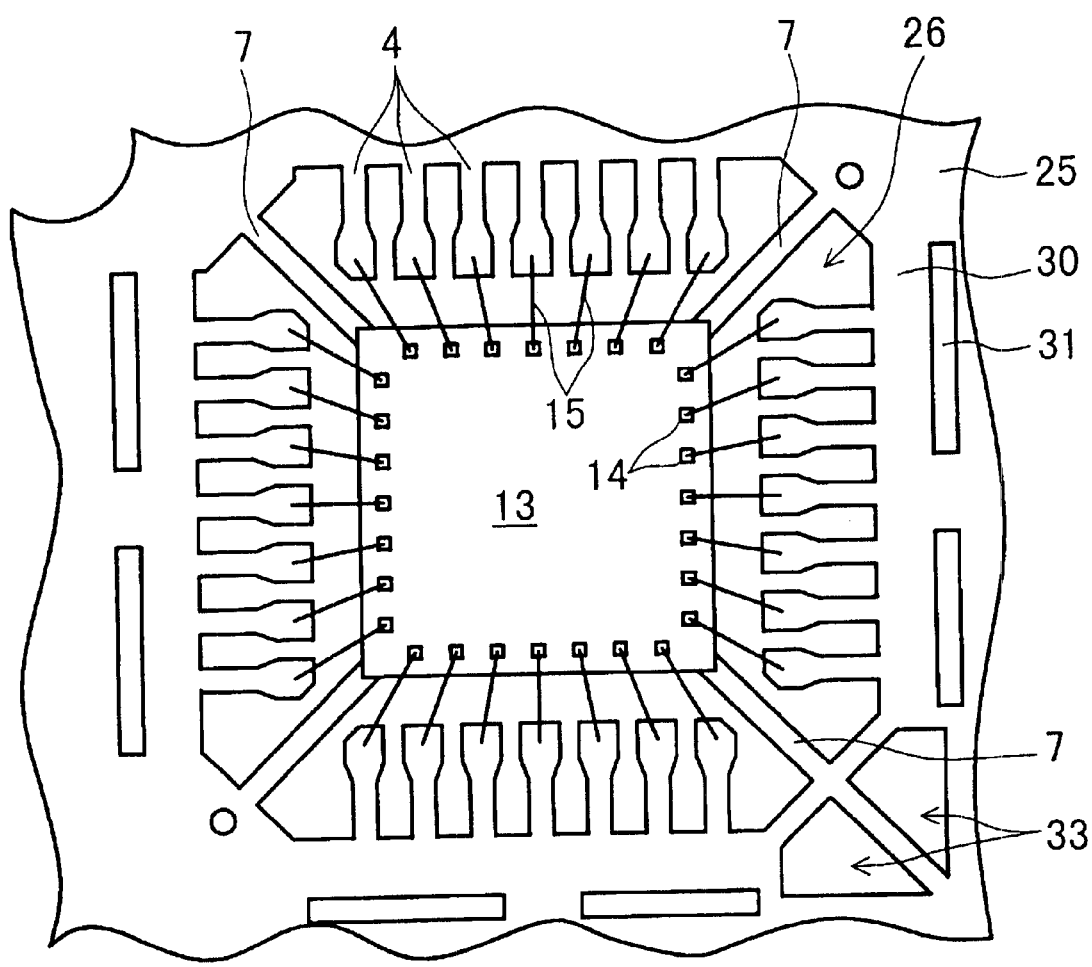
FIG. 43 is a plan view showing a state in which a semiconductor chip is secured on a unit leadframe pattern and conductive wires are connected between electrodes of the semiconductor chip and inner lead end parts in the semiconductor device fabrication method according to the preferred embodiment 2 of the present invention.
Figure 44:
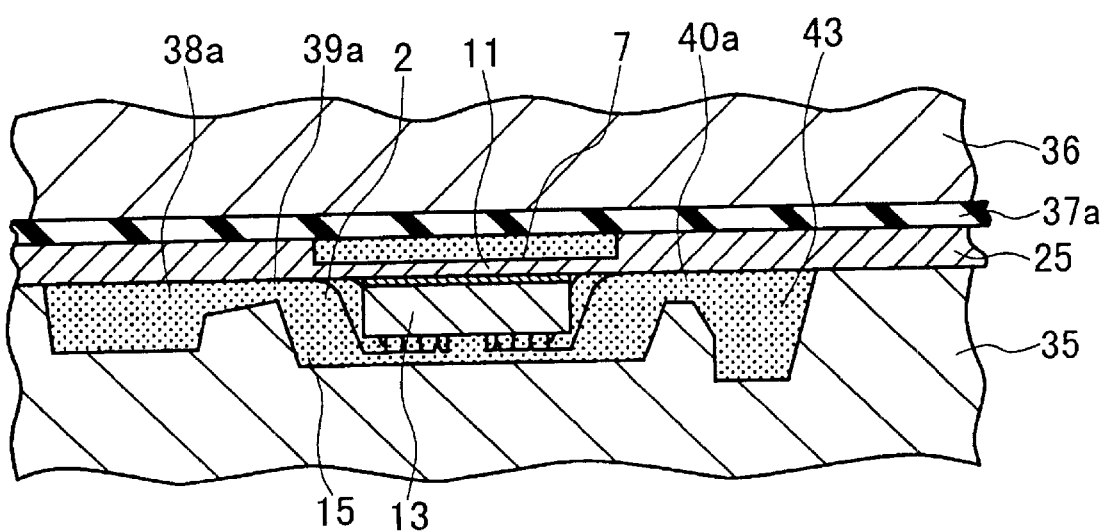
FIG. 44 is a schematic cross-sectional view showing a single-sided molding arrangement in the semiconductor device fabrication method according to the preferred embodiment 2 of the present invention.

Then, a semiconductor chip 13 is secured on the tab 11 (chip bonding: S202), and each electrode 14 of the semiconductor chip 13 and the inner end part of each lead 4 are connected through a conductive wire 15 to provide electrical connection as shown in FIG. 43 (wire bonding: S203).

Thereafter, on the leadframe 25 on which the semiconductor chips 13 have been assembled as mentioned above, single-sided molding is performed to form a package part 2 (molding: S204). In this single-sided molding, a sheet is interleaved between the leadframe 25 and an upper half mold 36 similarly to that in the preferred embodiment 1.

In the single-sided sheet molding in the preferred embodiment 2, an adhesive sheet 37a is used. The adhesive sheet 37a is held on a mounting face of the package part 2 even after completion of molding. In the preferred embodiment 2, the sheet 37a is cut to have dimensions approximately equal to those of the leadframe 25. In this molding process (transfer molding), a contact-preventive part 43 higher (thicker) than the package part 2 is formed in the same manner as for the preferred embodiment 1.

Figure 45:
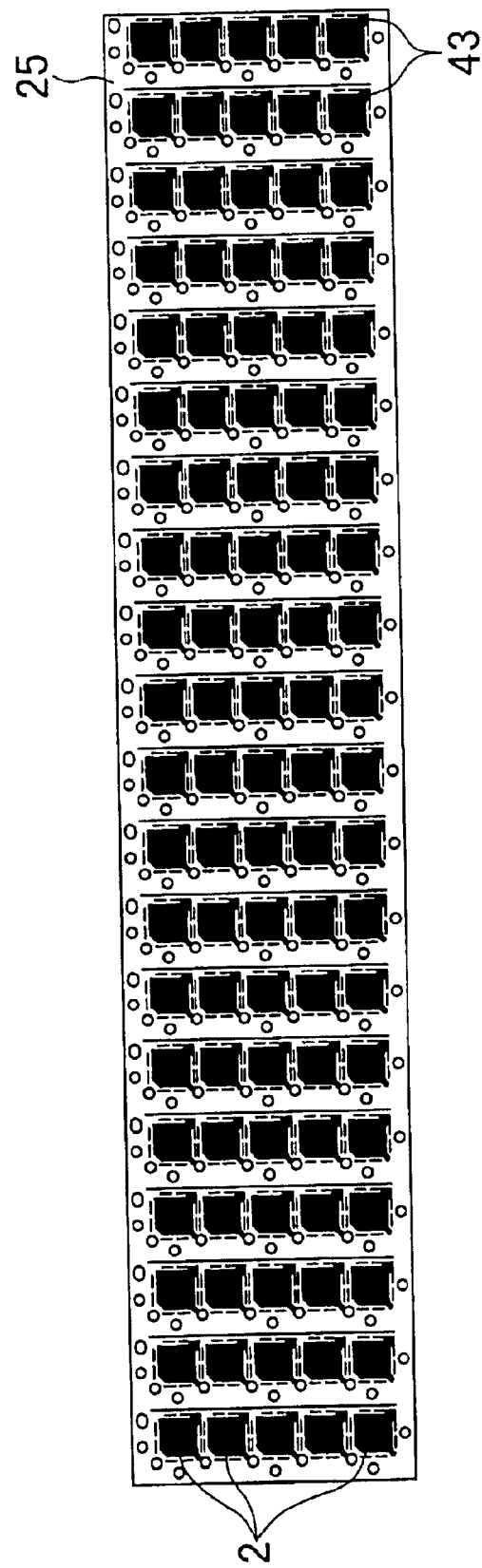
FIG. 45 is a plan view showing a leadframe on which package parts are formed by single-sided molding.
Figure 46:
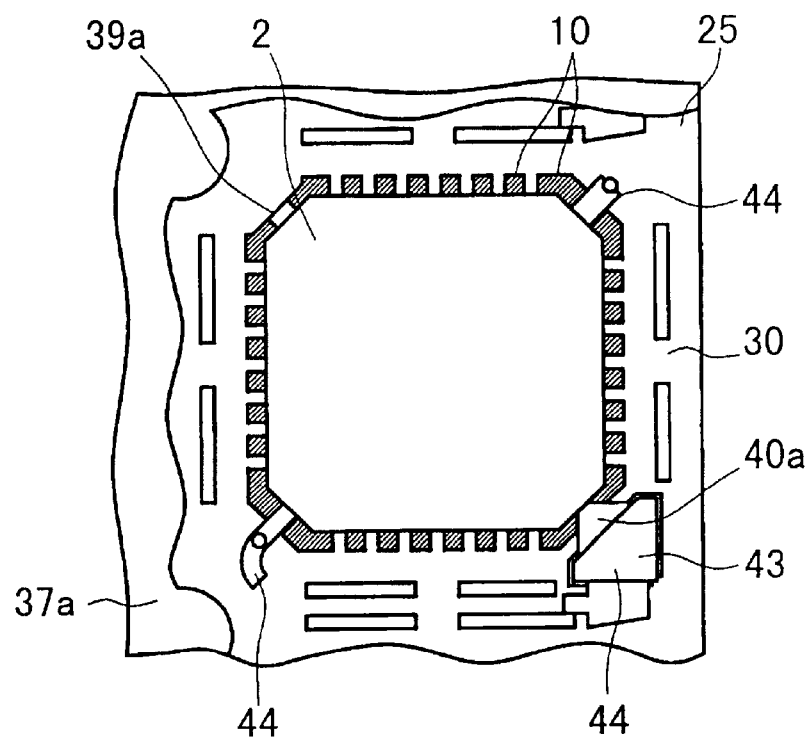
FIG. 46 is a plan view showing a unit leadframe pattern on which a package part is formed by the single-sided molding.
Figure 47:
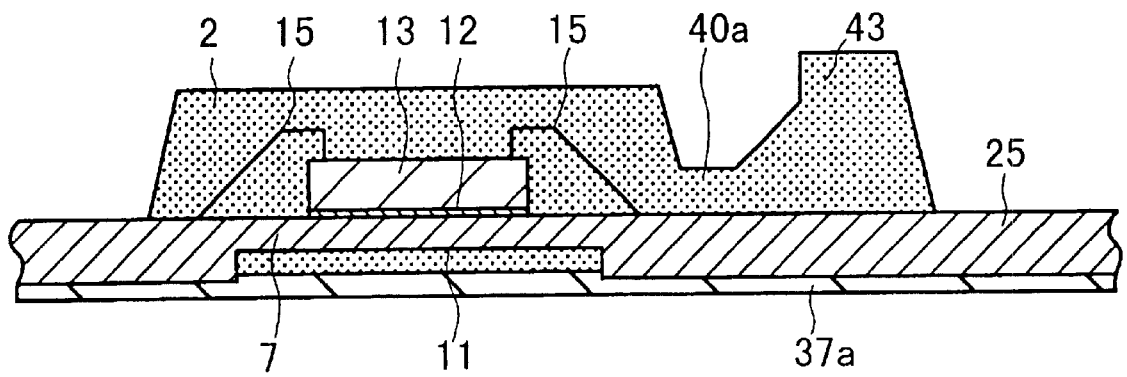
FIG. 47 is a cross-sectional view of the unit leadframe pattern on which the package part is formed by the single-sided molding.

FIG. 45 shows a plan view of the leadframe on which package parts are formed by single-sided molding, FIG. 46 shows a plan view of a unit leadframe pattern on which a package part is formed, and FIG. 47 shows a cross-sectional view of the unit leadframe pattern including the package part.

Figure 48:
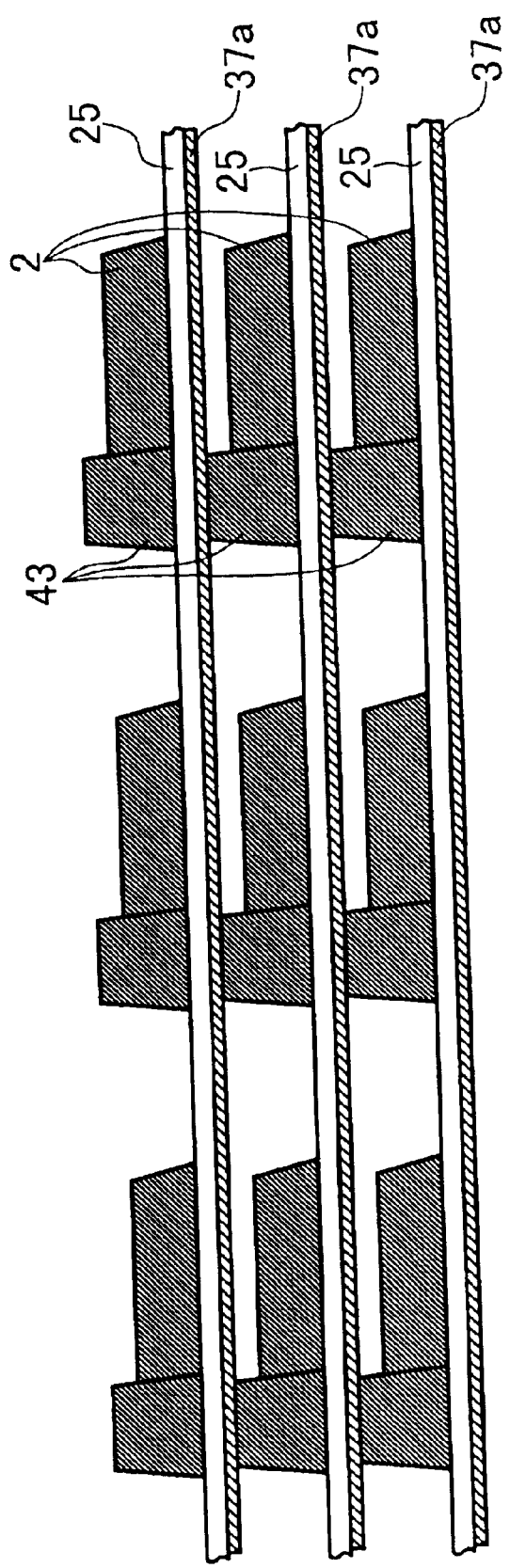
FIG. 48 is a schematic diagram showing a part of a stack of leadframes which have been processed through single-sided molding in the semiconductor device fabrication method according to the preferred embodiment 2 of the present invention.
Figure 49:
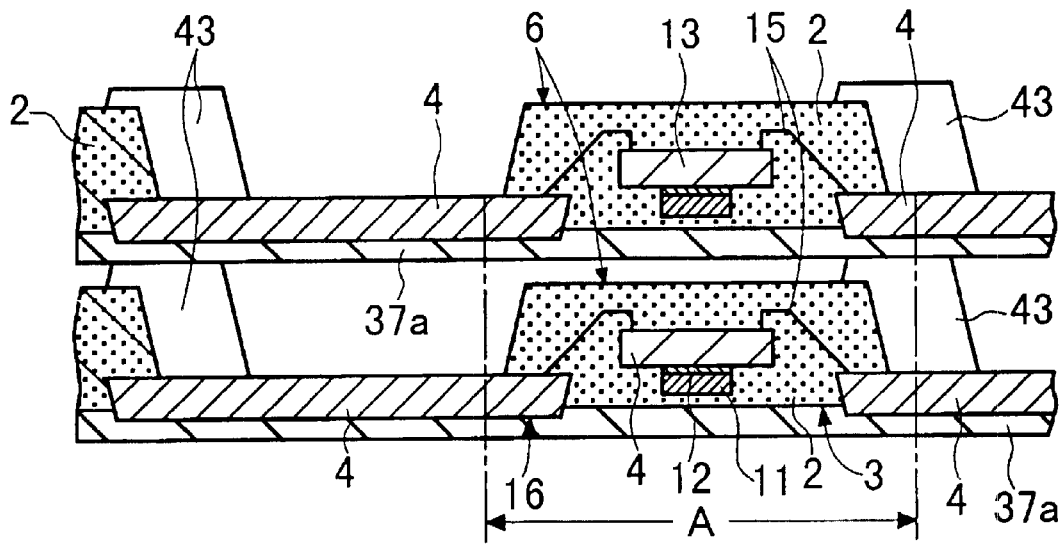
FIG. 49 is a cross-sectional view showing a part of a stack of leadframes which have been processed through single-sided molding in the semiconductor device fabrication method according to the preferred embodiment 2 of the present invention.

After the single-sided molding, the leadframes 25 are stored in a state such as shown in FIG. 48. Each leadframe 25 has a matrix pattern, and the contact-preventive part 43 higher than the package part 2 is formed in the vicinity of one corner of the package part 2 on each unit leadframe pattern. Therefore, in a stack of leadframes 25 shown in FIG. 48, the contact-preventive parts 43 on the leadframe 25 located at the bottom position support the leadframe 25 located at the intermediate position, and the contact-preventive parts 43 on the leadframe 25 located at the intermediate position support the leadframe 25 located at the top position. Thus, no external force due to contacting is exerted on the leads 7 and tab suspension leads 7 exposed on the package part 2. Further, in the preferred embodiment 2, since the leads 4 and tab suspension leads 7 are covered with the sheet 37a, the surfaces of the leads 4 and tab suspension leads 7 are positively protected from being flawed or contaminated with a foreign substance. In FIG. 49, there is shown a cross-sectional view of two leadframes 25 which are stacked one on top of another.

Then, using the press machine employed in the preferred embodiment 1 and the composite cutting die having the notch forming part in the first section thereof, the following process steps are carried out; notch forming (V groove forming: S205), press cutting of gate-set resin and flow-cavity-set resin (press cutting of tab suspension lead parts located thereon: S206), primary press cutting of lead tips (press cutting of leads extending in X direction: S207), secondary press cutting of lead tips (press cutting of leads extending in Y direction: S208), and press cutting of residual tab suspension leads (press cutting of air vents: S209). At these cutting process steps, the leadframes 25 are stored and supplied in a state such as shown in FIG. 48.

Figure 50:
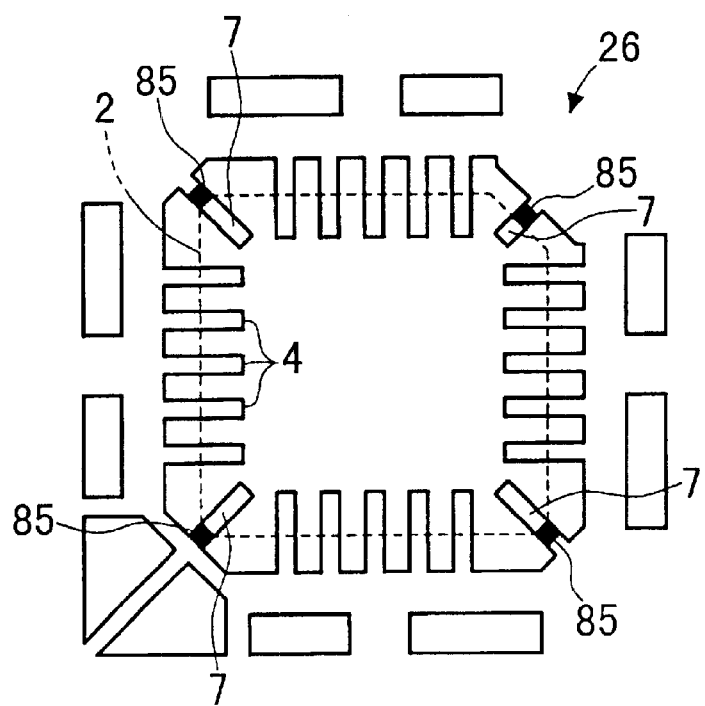
FIG. 50 is a schematic plan view showing a unit leadframe pattern having a notch on a tab suspension lead thereof in the semiconductor device fabrication method according to the preferred embodiment 2 of the present invention.

The leadframe 25 is turned upside down and sandwiched between the upper half mold and lower half mold of the composite cutting die for cutting process. FIG. 50 shows a schematic plan view indicating a leadframe condition in which a notch (V groove) 85 is formed on each tab suspension lead 7 in the notch forming step (S205) (refer to FIG. 52).

In the step of press cutting of gate-set resin and flow-cavity-set resin (S206), the stippled regions in FIG. 51 are cut off by a punch 76. Each of these regions corresponds to a part of the tab suspension lead 7 where the notch (V groove) 85 is formed, and the bottom of the V groove corresponds to a cut line. FIG. 52 shows a cut-off condition using a die 75 and the punch 76. The punch 76 is driven along a guide 86. In this cutting, the sheet 37a is held on the leadframe 25. The leadframe 25 and the sheet 37a are cut in the direction from the positional side of the sheet 37a to the positional side of the package part 2. Thus, the periphery (peripheral edge) of a mounting face 16 of the package part 2 is formed in a smooth line free from burrs. When the semiconductor device 1 is mounted on a wiring board, a mounting defect due to burrs will not take place.

Then, as in the case of the preferred embodiment 1, the process steps of primary press cutting of lead tips (S207), secondary press cutting of lead tips (S208), and press cutting of residual tab suspension leads (S209) are carried out (not shown). Then, the package part 2 is removed from the leadframe 25, and a non-leaded semiconductor device 1

(QFN semiconductor device 1) such as shown in FIGS. 37 to 39 can thus be provided. The leads 4 and tab suspension leads 7 are cut off at the root region of the package part 2. A jut length of each of the leads 4 and tab suspension leads 7 is 0.1 mm or less, for example.

In the cutting of the leads 4 and tab suspension leads 7, since the leads 4 and tab suspension leads 7 are cut by means of die-punch cutting in which the punch is driven from the mounting face side of the package 2, cutting burrs will not occur at a cut-line edge on the mounting face side while they may occur at a cut-line edge on the side opposite to the mounting face side. Thus, in addition to improvement in the appearance of the non-leaded semiconductor device 1, occurrence of a mounting defect due to cutting burrs can be prevented.

Resin burrs are produced between the leads 4 and between each tab suspension lead 7 and its adjacent lead 4 in the root region of the package 2 in the molding process. These resin burrs are also cut off when the leads 4 and tab suspension leads 7 are cut. Thus, the leads 4, tab suspension leads 7, and resin burrs are trimmed in a straight line on the periphery of the package part 2.

In the semiconductor device 1 according to the preferred embodiment 2, since the mounting face of the package part 2 is covered with the sheet 37a, the surfaces of the leads 4 and tab suspension leads 7 exposed on the mounting face of the package part 2 are positively protected from being flawed or contaminated with a foreign substance.

Therefore, the semiconductor 1 is to be shipped with the sheet 37a attached thereon, or immediately before shipment, the sheet 37a is to be removed from the semiconductor 1 and stored in a tray or the like. For ensuring high reliability in mounting, it is preferable to leave the sheet 37a on the semiconductor 1 until a point in time immediately before the semiconductor 1 is mounted on a wiring board.

In FIGS. 54A and 54B, there is shown an example of a package part 2 having a nick 90 at and around a resin burr part 10 which has been incurred in the step of press cutting of gate-set resin and flow-cavity-set resin (press cutting of tab suspension leads located thereon). In cases where the gate-set resin and flow-cavity-set resin are cut with the sheet 37a attached on the package part 2 as in the preferred embodiment 2, the sheet 37a serves as a reinforcing member to prevent occurrence of a nick at and around the resin burr part 10.

In the preferred embodiment 2, fine resin chippings produced at the time of cutting adhere to the sheet 37a, and these fine resin chippings will not come off the sheet 37a during transport, thus not causing contamination on facilities used for semiconductor device fabrication. Further, since the fine resin chippings are eliminated together with the sheet 37a when the sheet 37a is removed from the semiconductor device 1, no contamination will occur on the semiconductor device 1 and a working environment area.

In FIGS. 53A and 53B, there is shown an example of a removal technique for removing the sheet 37a from the semiconductor device 1. For example, as shown in FIG. 53A, the semiconductor device 1, being turned upside down, is set in a pocket 92 of a sheet removal station 91. The pocket 92 has a vacuum holder pit 93 for increasing a vacuum suction force, and at the bottom of the vacuum holder pit 93, there is provided a suction hole 94 connected to a vacuum suction mechanism.

The semiconductor device 1 set in the pocket 92 is vacuum-chucked by activating the vacuum suction mechanism. The sheet 37a attached on the semiconductor device 1 is also vacuum-chucked by a vacuum nozzle 95. In this state, the vacuum nozzle 95 is moved upward from the semiconductor device 1 as shown in FIG. 53B. Thus, the sheet 37a can be removed from the package part 2 of the semiconductor device 1.

Then, the vacuum nozzle 95 holding the sheet 37a is moved to a predetermined position, and the vacuum nozzle 95 releases the sheet 37a for discard. Thereafter, the vacuum nozzle 95 is returned to the pocket 92. At this step, the semiconductor device 1 is vacuum-chucked by the vacuum nozzle 95. Then, the vacuum nozzle 95 holding the semiconductor device 1 is moved to another predetermined position, and the semiconductor device 1 is flipped over for mounting the semiconductor device 1 on a wiring board or for storing the semiconductor device 1 in a shipment tray or the like.

It is to be understood that any means other than the above may be used for removing the sheet 37a from the package part 2 of the semiconductor device 1.

In the preferred embodiment 2, some of the advantageous effects of the preferred embodiment 1 can be provided. Further, according to the semiconductor device fabrication method of the preferred embodiment 2, the leadframe 25 is covered with the sheet 37a. Therefore, when the leadframes 25 are stacked one on top of another, external electrode terminals of a leadframe 25 at the upper position does not come into direct contact with a package part 2 of another leadframe 25 at the lower position since the sheet 37a is located between the leadframes 25 at the upper and lower positions, thus preventing occurrence of a flaw and contamination on the external electrode terminals of the leadframe 25 at the upper position. Moreover, when the leadframes 25 are stacked one on top of another, no external force due to contacting with a package part 2 of a leadframe 25 at the lower position will not be exerted on external electrode terminals of a leadframe 25 at the upper position since the contact-preventive part 43 is located between the leadframes 25 at the upper and lower positions, thus preventing damage to the external electrode terminals of the leadframe 25 at the upper position.

In this manner, a non-leaded semiconductor device having high reliability in mounting can be provided, which allows production of an electronic apparatus having excellent quality and high reliability.

While the present invention has been described in detail with respect to specific embodiments thereof, it is to be understood that the invention is not limited by any of the details of description and that various changes and modifications may be made in the invention without departing from the spirit and scope thereof.

Although the plating process is carried out after the single-sided molding in the preferred embodiment 1, the plating process (pre-plating) may be performed after leadframe formation. In this case, a palladium plating film may be formed for avoiding the use of Pb as a soldering material, for example. In this arrangement, after the single-sided molding, it is also possible to prevent occurrence of a flaw and contamination on the surfaces of external electrode terminals.

Further, while the present invention has been described as related to application examples for fabrication of QFN semiconductor devices, it is to be understood that the present invention is also applicable to fabrication of other types of semiconductor devices. For example, the present invention is applicable to fabrication of SON semiconductor devices to provide the same advantageous effects as in fabrication of QFN semiconductor devices. It will be obvious to those skilled in the art that the present invention is applicable to fabrication of any semiconductor devices of a non-leaded package type.

As set forth hereinabove, the present invention provides the following representative advantageous features and effects:

(1) Since the mounting surfaces of external electrode terminals are not likely to be flawed or contaminated with a foreign substance in semiconductor device fabrication, it is possible to fabricate non-leaded semiconductor devices having satisfactory mounting performance.

(2) Since cutting burrs do not occur at cut-line edges of the mounting surfaces of external electrode terminal leads and tab suspension leads, a mounting defect due to cutting burrs can be eliminated to enhance mounting reliability.

(3) In electronic apparatus production, since the mounting surfaces of external electrode terminals of a non-leaded semiconductor device are not likely to be flawed or contaminated with a foreign substance, the mounting performance of the non-leaded semiconductor device is improved to allow production of an electronic apparatus having excellent quality and high reliability.

What is claimed is:

1. A semiconductor device fabrication method comprising the steps of:
   preparing a matrix-type leadframe containing a matrix of unit leadframe patterns, each of which comprises a frame part, a tab located inside said frame part, a plurality of tab suspension leads extending from said frame part to said tab for supporting said tab by tip ends thereof, and a plurality of terminal leads extending from said frame part toward said tab;
   securing a semiconductor chip on said tab;
   connecting conductive wires between electrodes of said semiconductor chip and inner end parts of said terminal leads;
   performing single-sided molding to encapsulate said semiconductor chip, said conductive wires, and said inner end parts of said terminal leads in an insulating resin package part in a fashion that said terminal leads and tab suspension leads are exposed on a mounting face of said package part; and
   cutting said terminal leads and tab suspension leads;
   wherein, at the step of said single-sided molding, a contact-preventive part thicker than said package part is formed outside said package part, and at the step of said lead cutting, said contact-preventive part is cut.

2. A semiconductor device fabrication method as claimed in claim 1,
   wherein, at the step of said single-sided molding, said contact-preventive part is formed at a position diagonally opposite to a resin injection position for forming said package part, and air vents for releasing air in formation of said package part are provided at a position where said contact-preventive part is formed and at positions on both sides with respect to a diagonal line between said resin injection position and said position where said contact-preventive part is formed.

3. A semiconductor device fabrication method as claimed in claim 1,
   wherein, at the step of said single-sided molding, an elastic sheet is attached on said leadframe, and said sheet and said leadframe are sandwiched between upper and lower half molds to form said package part on a face of said leadframe where said sheet is not attached.

4. A semiconductor device fabrication method as claimed in claim 1,
   wherein, after the step of said single-sided molding, a plating film for mounting is formed at each predetermined region of said matrix-type leadframe.

5. A semiconductor device fabrication method as claimed in claim 1,
   wherein, at the step of said lead cutting, said terminal leads and tab suspension leads are cut by means of die-punch cutting in which a punch is driven from a positional side of said mounting face of said package part.

6. A semiconductor device fabrication method as claimed in claim 1,
   wherein, before said semiconductor chip is secured on said tab, plating is performed to form a plating film for mounting at each predetermined region of said matrix-type leadframe.

7. A semiconductor device fabrication method as claimed in claim 6,
   wherein a palladium plating film is formed in said plating.

8. A semiconductor device fabrication method as claimed in claim 1,
   wherein, after said package part and said contact-preventive part are formed on each unit leadframe pattern of said matrix-type leadframe, a plurality of said matrix-type leadframes thus processed are stacked one on top of another in a fashion that a matrix-type leadframe at each upper stack position is placed on each contact-preventive part of a matrix-type leadframe at each lower stack position in cases where a plurality of said matrix-type leadframes are stored or supplied.

9. A semiconductor device fabrication method comprising the steps of:
   preparing a matrix-type leadframe containing a matrix of unit leadframe patterns, each of which comprises a frame part, a tab located inside said frame part, a plurality of tab suspension leads extending from said frame part to said tab for supporting said tab by tip ends thereof, and a plurality of terminal leads extending from said frame part toward said tab;
   securing a semiconductor chip on said tab;
   connecting conductive wires between electrodes of said semiconductor chip and inner end parts of said terminal leads;
   performing single-sided molding to encapsulate said semiconductor chip, said conductive wires, and said inner end parts of said terminal leads in an insulating resin package part in a fashion that said terminal leads and tab suspension leads are exposed on a mounting face of said package part; and
   cutting said terminal leads and tab suspension leads;
   wherein, at the step of said single-sided molding, an elastic sheet is attached on said leadframe, and said sheet and said leadframe are sandwiched between upper and lower half molds to form said package part on a face of said leadframe where said sheet is not attached, and
   wherein, at the step of said lead cutting, said terminal leads and tab suspension leads are cut with said sheet attached on said leadframe.

10. A semiconductor device fabrication method as claimed in claim 9,
    wherein, before the step of said single-sided molding, plating is performed to form a plating film for mounting at each predetermined region of said matrix-type leadframe.

11. A semiconductor device fabrication method as claimed in claim 9, wherein, after said package part is formed on each unit leadframe pattern of said matrix-type leadframe, a plurality of said matrix-type leadframes thus processed are stacked one on top of another with said sheet attached on each said matrix-type leadframe in cases where a plurality of said matrix-type leadframes are stored or supplied.

12. A semiconductor device fabrication method as claimed in claim 9, wherein, after said terminal leads and tab suspension leads are cut, said sheet is removed from said package part, said terminal leads and said tab suspension leads.

13. A semiconductor device fabrication method as claimed in claim 9, wherein said sheet is removed from said package part by vacuum-chucking said package part, vacuum-chucking said sheet with a vacuum nozzle, and moving said vacuum nozzle away from said package part.

14. A method of manufacturing an electronic apparatus through semiconductor device fabrication, comprising the steps of:

preparing a matrix-type leadframe containing a matrix of unit leadframe patterns, each of which comprises a frame part, a tab located inside said frame part, a plurality of tab suspension leads extending from said frame part to said tab for supporting said tab by tip ends thereof, and a plurality of terminal leads extending from said frame part toward said tab;

securing a semiconductor chip on said tab;

connecting conductive wires between electrodes of said semiconductor chip and inner end parts of said terminal leads;

performing single-sided molding to encapsulate said semiconductor chip, said conductive wires, and said inner end parts of said terminal leads in an insulating resin package part in a fashion that said terminal leads and tab suspension leads are exposed on a mounting face of said package part;

cutting said terminal leads and tab suspension leads to provide a semiconductor device; and thereafter surface-mounting said semiconductor device on a predetermined wiring board for electronic apparatus production;

wherein, at the step of said single-sided molding, an elastic sheet is attached on said leadframe, and said sheet and said leadframe are sandwiched between upper and lower half molds to form said package part on a face of said leadframe where said sheet is not attached, wherein, at the step of said lead cutting, said terminal leads and tab suspension leads are cut with said sheet attached on said leadframe to provide said semiconductor device, and wherein, after said sheet is removed from said package part, said semiconductor device is surface-mounted on said wiring board to produce an electronic apparatus.

* * * * *